US010199104B2

(12) United States Patent
Hsu

(10) Patent No.: US 10,199,104 B2
(45) Date of Patent: Feb. 5, 2019

(54) METHOD AND APPARATUS FOR PROVIDING MULTI-PAGE READ AND WRITE USING SRAM AND NONVOLATILE MEMORY DEVICES

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days.

(21) Appl. No.: 15/891,284

(22) Filed: Feb. 7, 2018

(65) Prior Publication Data

US 2018/0166139 A1 Jun. 14, 2018

Related U.S. Application Data

(62) Division of application No. 14/855,323, filed on Sep. 15, 2015, now Pat. No. 9,928,911.

(60) Provisional application No. 62/050,755, filed on Sep. 15, 2014, provisional application No. 62/062,909, filed on Oct. 12, 2014.

(51) Int. Cl.
*G11C 16/24* (2006.01)
*G11C 14/00* (2006.01)
*G11C 16/10* (2006.01)
*G11C 16/04* (2006.01)
(Continued)

(52) U.S. Cl.
CPC ........ *G11C 14/0063* (2013.01); *G11C 11/005* (2013.01); *G11C 11/419* (2013.01); *G11C 16/0483* (2013.01); *G11C 16/10* (2013.01)

(58) Field of Classification Search
CPC ..... G11C 14/00; G11C 16/0483; G11C 16/10; G11C 16/24; G11C 16/0475
See application file for complete search history.

(56) References Cited

U.S. PATENT DOCUMENTS 7,092,289 B1 8/2006 Wong
7,499,322 B2 3/2009 Lee et al.
(Continued)

OTHER PUBLICATIONS

International Search Report, dated Jan. 29, 2016, for corresponding International Application No. PCT/US2015/050293.
(Continued)

*Primary Examiner* — Hien Nguyen
(74) *Attorney, Agent, or Firm* — Intellectual Property Law Group LLP

(57) ABSTRACT

A memory device includes a static random-access memory ("SRAM") circuit and a first nonvolatile memory ("NVM") string, a second NVM string, a first and a second drain select gates ("DSGs"). The SRAM circuit is able to temporarily store information in response to bit line ("BL") information which is coupled to at the input terminal of the SRAM circuit. The first NVM string having at least one nonvolatile memory cell is coupled to the output terminal of the SRAM. The first DSG is operable to control the timing for storing information at the output terminal of the SRAM to the first nonvolatile memory. The second NVM string having at least one nonvolatile memory cell is coupled to the output terminal of the SRAM. The second DSG controls the timing for storing information at the output terminal of the SRAM to the second nonvolatile memory string.

20 Claims, 23 Drawing Sheets

(51) Int. Cl.
*G11C 11/419* (2006.01)
*G11C 11/00* (2006.01)

(56) References Cited

U.S. PATENT DOCUMENTS

| | | | |
|---|---|---|---|
| 7,623,384 B2 | 11/2009 | Iwata | |
| 7,710,776 B2 | 5/2010 | Johal et al. | |
| 2006/0023503 A1* | 2/2006 | Lee .................. | G11C 14/00 |
| | | | 365/185.05 |
| 2010/0290286 A1* | 11/2010 | Koya ............... | G11C 16/0483 |
| | | | 365/185.08 |
| 2013/0258771 A1 | 10/2013 | Lee et al. | |
| 2014/0050025 A1 | 2/2014 | Tsao et al. | |

OTHER PUBLICATIONS

Written Opinion of the International Searching Authority, dated Jan. 29, 2016, for corresponding International Application No. PCT/US2015/050293.

* cited by examiner

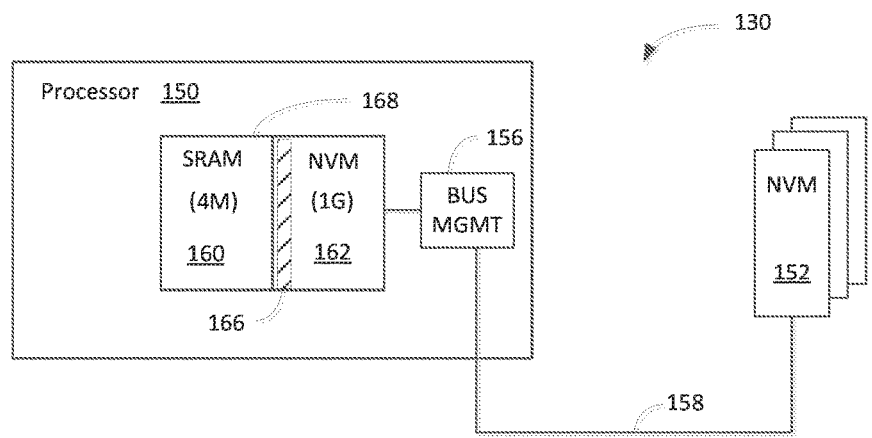
FIG. 1A
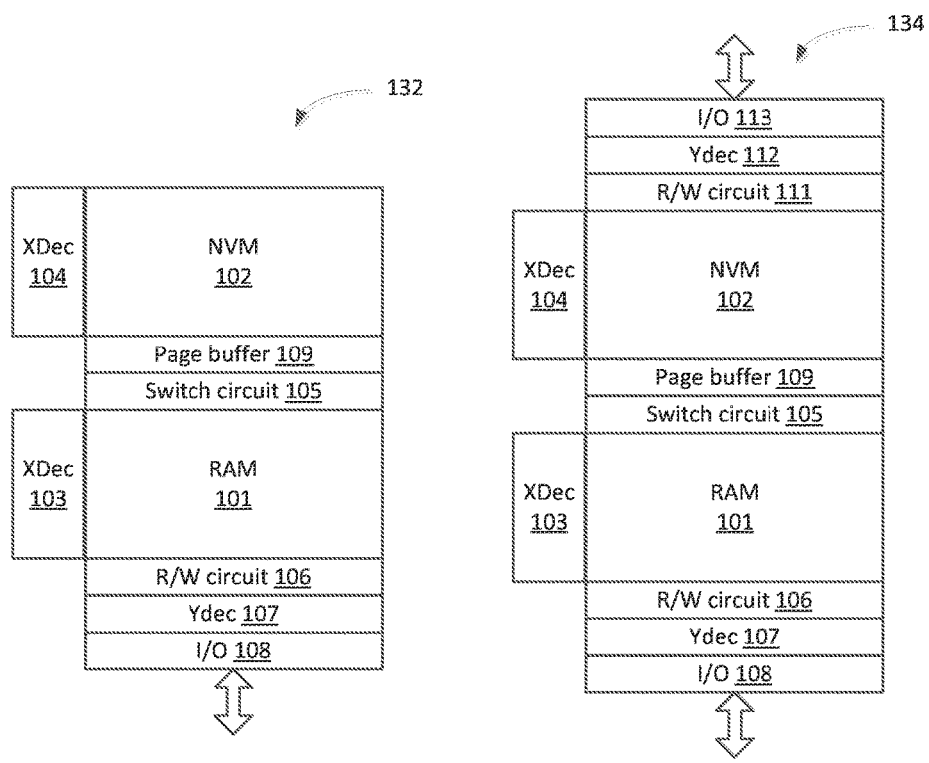
FIG. 1B
FIG. 1C

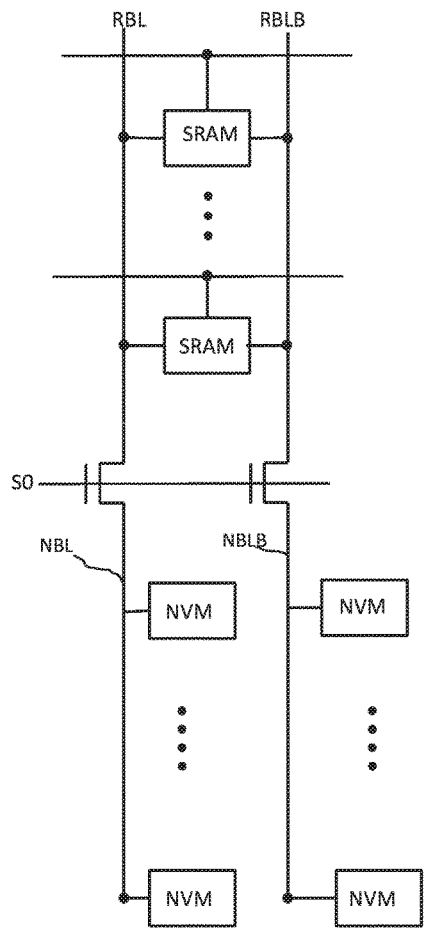
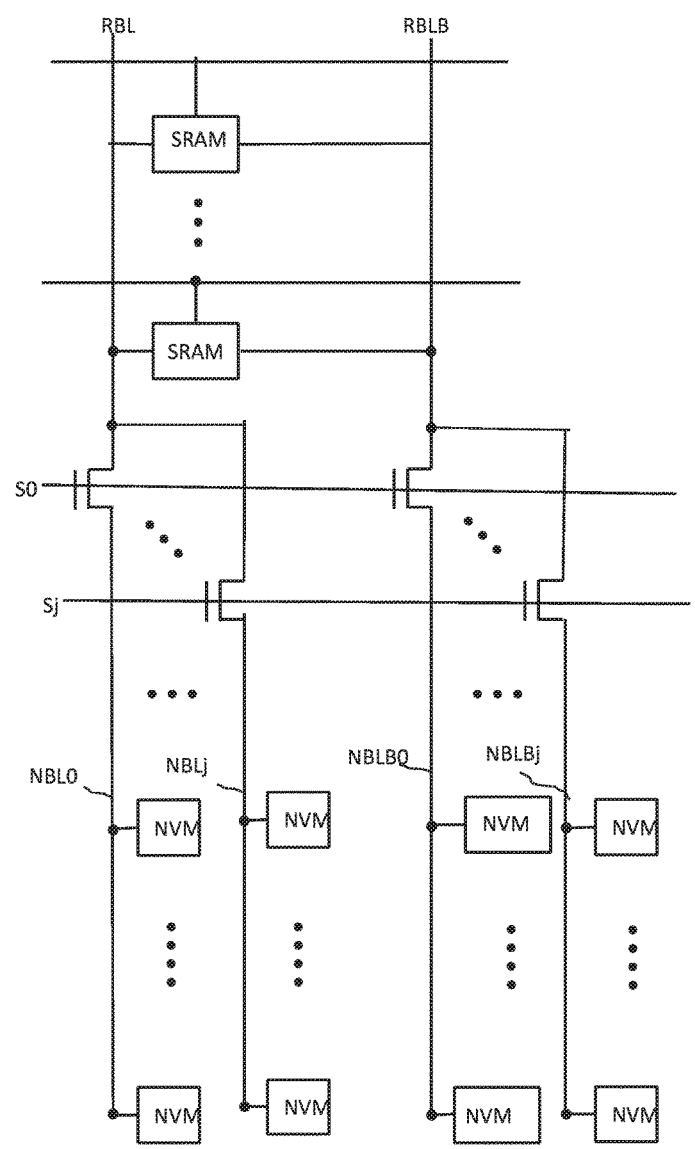
FIG. 4A
FIG. 4B

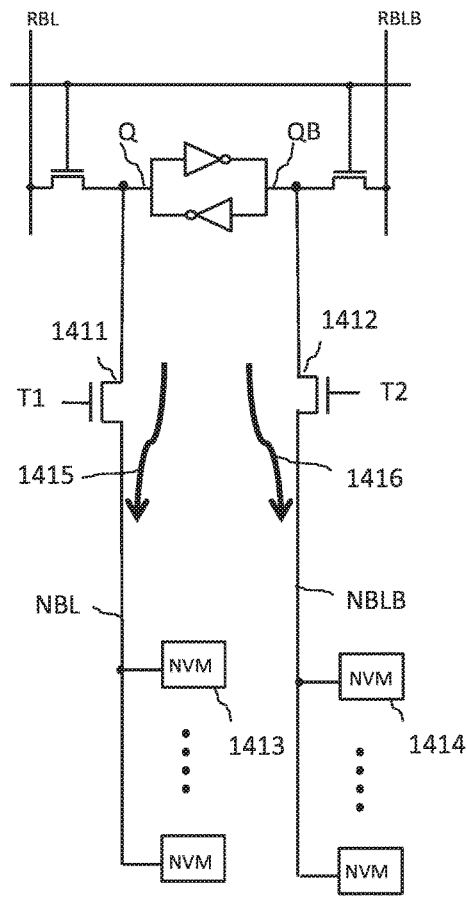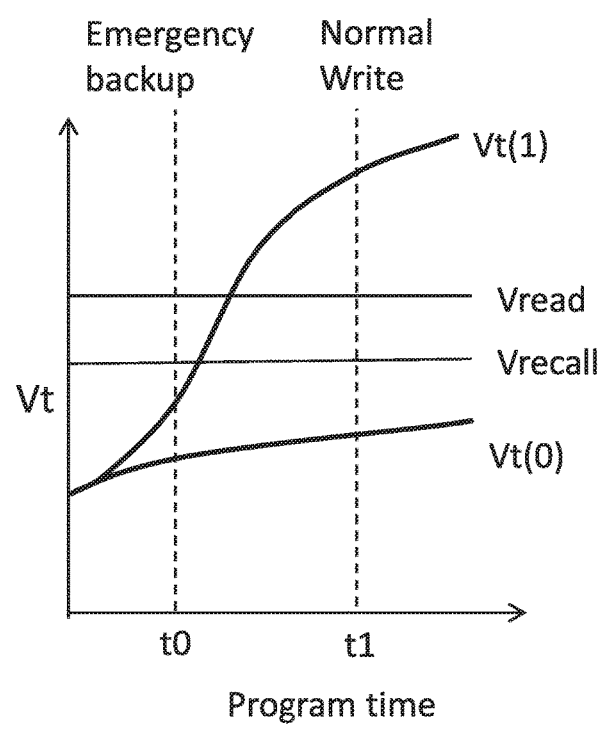
FIG. 9
FIG. 10

|  | SRAM Cell | | | NAND Cell | | | | |
| --- | --- | --- | --- | --- | --- | --- | --- | --- |
|  | SVDD | SVSS | SWL | DSG | NWL Selected | NWL Unselected | SSG | SL |
| Erase 1 | VDD | 0V | 0V | 0V | VNN | 0V | 0V | FL |
| Program | VDD | 0V | 0V | VDD | VPP | Vmp | 0V | VDD |
| Erase 2 | VDD | 0V | 0V | 0V | Vmn | >Vmp | >Vmp | Vmp |
FIG. 18A
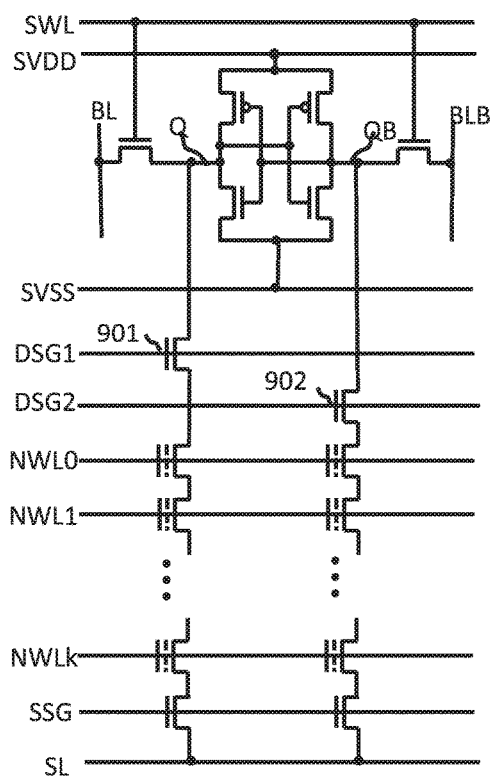
FIG. 18B
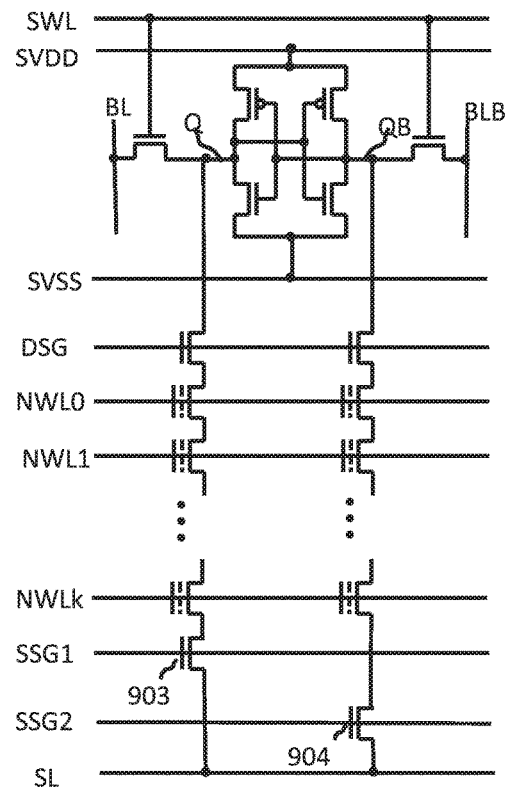
FIG. 18C

METHOD AND APPARATUS FOR PROVIDING MULTI-PAGE READ AND WRITE USING SRAM AND NONVOLATILE MEMORY DEVICES

CROSS-REFERENCE TO RELATED APPLICATIONS

This application is a divisional of commonly owned U.S. patent application Ser. No. 14/855,323 filed on Sep. 15, 2015, which claims the benefit of priority based upon U.S. Provisional Patent Application Ser. No. 62/050,755, filed on Sep. 15, 2014 and entitled "Novel Memory Array Combining RAM, NVM, and NVRAM," and U.S. Provisional Patent Application Ser. No. 62/062,909, filed on Oct. 12, 2014 and entitled "NVSRAM with SRAM and NAND Cells Structure," all of which are hereby incorporated herein by reference in their entireties.

FIELD OF THE INVENTION

The exemplary embodiment(s) of the present invention relates to the field of semiconductor and integrated circuits. More specifically, the exemplary embodiment(s) of the present invention relates to memory and storage devices.

BACKGROUND OF THE INVENTION

Nonvolatile memory ("NVM"), such as NAND or NOR based flash memory, is widely used in today's technology world. Its unique cell and array structure provide a small cell size, high density, low write current, and higher data throughout. NVM such as NAND based flash memory becomes major storage memory for various devices and systems, such as memory cards, USB flash drives, and solid-state drives. Some exemplary applications of flash memory include personal computers, PDAs, digital audio players, digital cameras, mobile phones, synthesizers, video games, scientific instrumentation, industrial robotics, and medical electronics. NAND flash memory technology, for example, has reached 16 nanometers ("nm"), and its single-chip density can reach 128 gigabit ("Gb") storage capacity.

A problem, however, associated with conventional NVM based flash memory is that it has a relatively slow programming speed. A reason for a slow programming speed and/or erasing speed is that a conventional NVM flash memory performs single-page programming at a given time. For some applications, a slow programming and/or erasing speed in a nonvolatile memory storage becomes a limitation and/or drawback.

Another drawback associated with NVM is that it takes a relative long time to transfer data from SRAM to an off-chip NVM memory device.

SUMMARY

One embodiment of the present invention discloses a memory device containing a random-access memory ("RAM") array, a nonvolatile memory ("NVM") array, and a switch circuit for storing information. The RAM array, in one example, is organized in multiple rows and multiple columns wherein the columns of the RAM array are configured to couple to RAM bit lines ("BLs") for accessing BL data of a RAM page. The NVM array which is organized in multiple rows and multiple columns is coupled to NVM BLs operable to access BL data of a NVM page. The switch circuit is configured to control the connection between the RAM BLs and the NVM BLs for data storage from the RAM array to the NVM array.

In an alternative embodiment, the memory device includes a static random-access memory ("SRAM") circuit, a first NVM string, a second NVM string, a first drain select gate ("DSG"), and a second DSG. The SRAM circuit, containing an input terminal and an output terminal, temporarily stores information in response to bit line ("BL") information which is coupled to at the input terminal of the SRAM circuit. The first NVM string having at least one nonvolatile memory cell is coupled to the output terminal of the SRAM. The first DSG is operable to control the timing for storing information at the output terminal of the SRAM to the first nonvolatile memory. The second NVM string having at least one nonvolatile memory cell is coupled to the output terminal of the SRAM. The second DSG controls the timing for storing information at the output terminal of the SRAM to the second nonvolatile memory string.

Additional features and benefits of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

FIGS. 1A-1D are block diagrams illustrating systems and memory devices containing both NVM and RAM in accordance with one embodiment of the present invention;

FIGS. 4A-4B illustrate chip layouts of OCM device showing SRAMs and NVMs in accordance with one embodiment of the present invention;

FIGS. 7-10 are block diagrams illustrating OCM devices containing RAM and NVM cells for backup as well as data storage in accordance with one embodiment of the present invention;

FIGS. 17-18C are diagrams illustrating alternative OCM device layout having SRAM and NVM in accordance with one embodiment of the present invention;

DETAILED DESCRIPTION

Figure 1D:
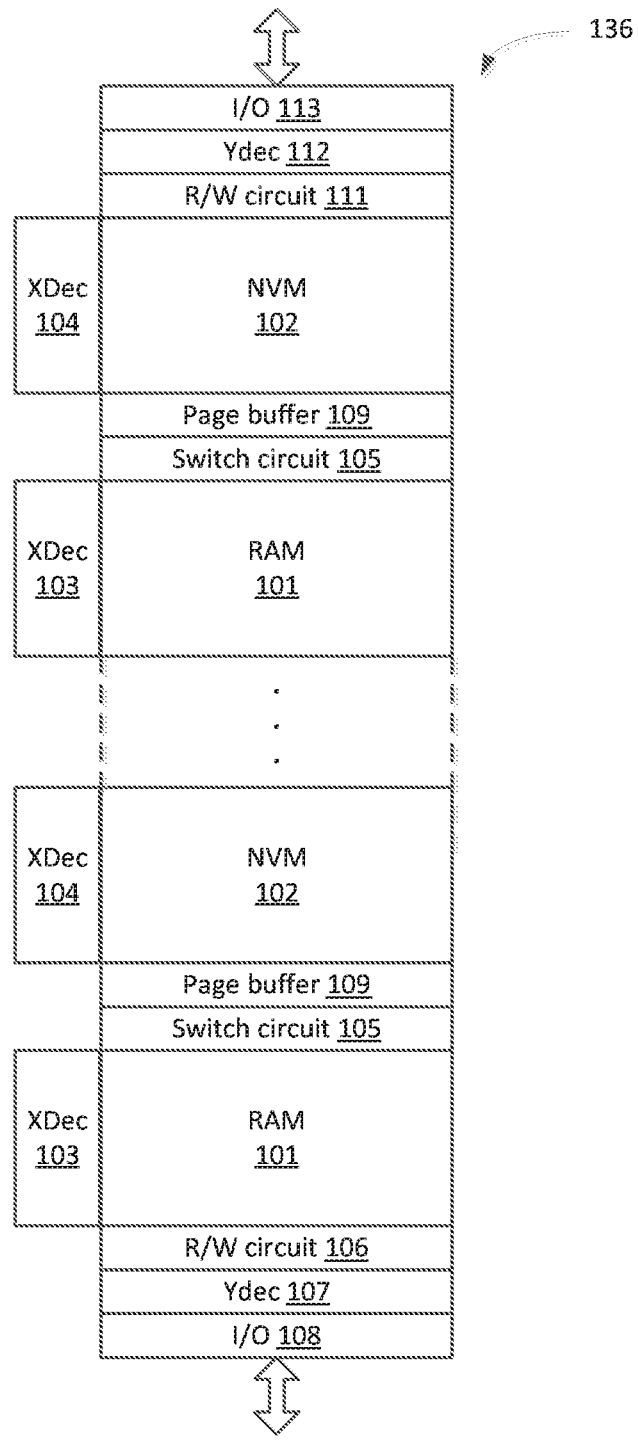

Exemplary embodiment(s) of the present invention is described herein in the context of a method, device, and apparatus for improving nonvolatile memory writing speed using multiple-page programming.

Those of ordinary skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processors and systems, control logic, ASICs, chips, workstations, mainframes, etc. The term "device" is used generically herein to describe any type of mechanism, including a computer or system or component thereof.

The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to the block and flow diagrams, are typically performed in a different serial or parallel ordering and/or by different components and/or over different connections in various embodiments in keeping within the scope and spirit of the invention.

One embodiment of the present invention discloses a memory device containing a random-access memory ("RAM") array, a nonvolatile memory ("NVM") array, and a switch circuit for storing information. The RAM array, in one example, is organized in multiple rows and multiple columns wherein the columns of the RAM array are configured to couple to RAM bit lines ("BLs") for accessing BL data of a RAM page. The NVM array which is organized in multiple rows and multiple columns, is coupled to NVM BLs operable to access BL data of a NVM page. The switch circuit is configured to control the connection between the RAM BLs and the NVM BLs for data storage from the RAM array to the NVM array.

In an alternative embodiment, the memory device includes a static random-access memory ("SRAM") circuit, a first NVM string, a second NVM string, a first drain select gate ("DSG"), and a second DSG. The SRAM circuit, containing an input terminal and an output terminal, temporarily stores information in response to bit line ("BL") information which is coupled to at the input terminal of the SRAM circuit. The first NVM string having at least one nonvolatile memory cell is coupled to the output terminal of the SRAM. The first DSG is operable to control the timing for storing information at the output terminal of the SRAM to the first nonvolatile memory. The second NVM string having at least one nonvolatile memory cell is coupled to the output terminal of the SRAM. The second DSG controls the timing for storing information at the output terminal of the SRAM to the second nonvolatile memory string.

FIG. 1A is a block diagram 130 illustrating a digital computing system containing a memory device having both NVM and RAM in accordance with one embodiment of the present invention. Diagram 130, in one embodiment, includes a processor 150, NVM storage 152, and a bus 158. Processor 150 further includes an on-chip memory 168 and a bus manager 156 wherein on-chip memory 168 also includes an SRAM 160 and an NVM 162. In one embodiment, SRAM 160 is coupled to NVM 162 for data storage as well as emergency backup. It should be noted that the underlying concept of the exemplary embodiment(s) of the present invention would not change if one or more blocks (or devices) were added to or removed from diagram 130.

On-chip memory 168, in one embodiment, is configured to facilitate a multiple-page programming scheme ("MPS") process able to program more than one page of NVM concurrently. Alternatively, on-chip memory 168 is capable of facilitate data transfer between SRAM 160 and NVM 152 via bus 158. Bus manager 156 is capable of simultaneously transferring data between NVM 162 of memory 168 and NVM 152. In another embodiment, on-chip memory 168 is able to backup data in SRAM to NVM 162 during an emergency shutdown or power loss. In one example, NVM 162 allocates a portion of NVM cells 166 for emergency backup purposes.

It should be noted that the density of NVM is generally higher than SRAM. For instance, a similar chip area capable of housing four (4) megabytes ("M") of SRAM could potentially fit one (1) to four (4) gigabytes ("G") of NVM. Embedding both SRAM and NVM in a single chip or die can enhance overall NVM performance.

An advantage of employing on-chip memory 168 containing both SRAM and NVM is that it facilitates concurrent multiple-page NVM programming. In addition, on-chip memory 168 also improves overall data transfer speed between on-chip memory 168 and NVM 152 using NVM 162. Furthermore, another advantage of using on-chip memory 168 is that it can backup data from SRAM to NVM cells during an emergency time.

FIGS. 1B-1D are block diagrams 132-136 illustrating on-chip memory containing both NVM and RAM in accordance with one embodiment of the present invention. Diagrams 132-136 illustrate various memory architectures that combine RAM and NVM in one array. The arrays, in one example, allow different densities of RAM and NVM, thus reassemble the traditional system's smaller RAM and larger NVM requirement to optimize the performance and cost. The RAM and NVM's bit lines are connected through a switch circuit such as switch circuit 105.

Switch circuit 105 allows the data be transferred between RAM and NVM in large page sizes which improves the data transfer speed between the two memories through external input and output ("I/O"). Moreover, during emergency power-down or power-loss, the entire RAM data can be backed up by writing the RAM data to a selected or predefined NVM location. An advantage of employing the array architecture combines RAM and NVM in one array is that it not only enhances the memory performance and reduces data transfer speed, but also provides NVSRAM data backup function in case of power-loss.

It should be noted that the on-chip memory architecture containing NVM and RAM such as memory 168 can be implemented in silicon level as an embedded memory block or a system level fabricated on a single semiconductor chip or die. Depending on the applications, the system level enhances the memory performance and reduces chip count and/or foot print for the overall system board. RAM, in one example, can be any type of volatile memory storage, such as SRAM, DRAM, SDRAM, 1T SRAM, and the like. Similarly, the NVM can be any type of persistent memory, such as EERPOM, NOR flash memory, NAND flash memory, and the like.

FIG. 1B is a logic diagram 132 illustrating an on-chip memory ("OCM") device containing NVM and RAM in accordance with one embodiment of the present application. OCM device is organized in an array configuration that contains RAM 101, NVM 102, x-row decoder ("XDEC") 103 for RAM, XDEC 104 for NVM, switch circuit 105, and page buffer 109 for NVM, read/write circuit 106 for RAM, y-column decoder ("YDEC") 107, and I/O 108. When switch circuit 105 is turned on, it, in example, connects multiple bit lines ("BLs") of RAM and NVM to allow data transferred between the two memories in page mode. RAM XDEC 103 and NVM XDEC 104, in one embodiment, are able to select pages independently whereby allowing the OCM device to store data at any SRAM page to any selected NVM page. It should be noted that the underlying concept of the exemplary embodiment(s) of the present invention would not change if one or more blocks (or devices) were added to or removed from diagram 130.

During operation, when writing any page of SRAM data to any page of NVM, switch circuit 105 is turned on to connect RAM BLs to NVM BLs. The selected data from SRAM page is loaded into page buffer 109. After switch circuit 105 is turned off to isolate the BLs between RAM and NVM, page buffer 109 starts to write the data into the selected NVM page. While the data in page buffer 109 is programmed into a page of NVM 102, RAM 101 can be used for other operations such as reading and/or writing. If any data in NVM 102 is required, the write operation can be interrupted and the selected data in NVM can be loaded to or RAM or SRAM, and the write operation to NVM 102 subsequently resumes.

Since the data transfer is operated in page mode, it generally takes less time to transfer the data between NVM and RAM. It should be noted that transferring data between NVM 102 and RAM 101 does not require using main or external bus whereby the data transferring speed between a volatile memory and a persistent memory is improved. Note that the RAM array architecture used as a frontend memory interfaces with the system and the NVM array architecture used as a backend memory feeds required data to and from RAM array can enhance overall system performance.

Page buffer 109 can be located in any location within the OCM device. For example, page buffer 109 can be placed near the boundary of RAM 101, NVM 102, or on the top of NVM 102. Alternatively, page buffer may be removed, and a selected RAM page may be designated as a buffer page supplying data to BLs to read and/or write selected NVM page(s). It should be noted that in some applications and designs, RAM 101 or RAM array may not be able to provide simultaneously read and write operations if one page of RAM is designated as a buffer page.

FIG. 1C is a logic diagram 134 showing another embodiment of array architecture of OCM device in accordance with one embodiment of present application. Diagram 134 is similar to diagram 132 shown in FIG. 1B except that diagram 134 includes another read/write ("R/W") circuit 111 for NVM, YDEC 112, and I/O circuit 113. R/W circuit 111, YDEC 112, and I/O circuit 113 are situated on top of NVM array 102. An advantage of employing R/W circuit 111 is that it allows a system to access NVM 102 and RAM 101 independently while RAM 101 and NVM 102 can still transfer data between each other through internal switch circuit 105. Note that without going through the external data bus, the data transfer time is shortened.

FIG. 1D is a logic diagram 136 showing another embodiment of array architecture of OCM device in accordance with one embodiment of present application. Diagram 136 is similar to diagram 134 shown in FIG. 1C except that diagram 136 includes multiple RAM blocks 101 and NVM blocks 102. BLs for each clock of RAM 101 can be connected to the associated BLs for a block of NVM through switch circuits 105. Page buffers 109 are used to write data to NVMs 102.

The advantage of using the OCM device having multiple RAMs and NVMs is that it allows a RAM block to transfer multiple pages of data to multiple NVM blocks simultaneously.

Figure 2:
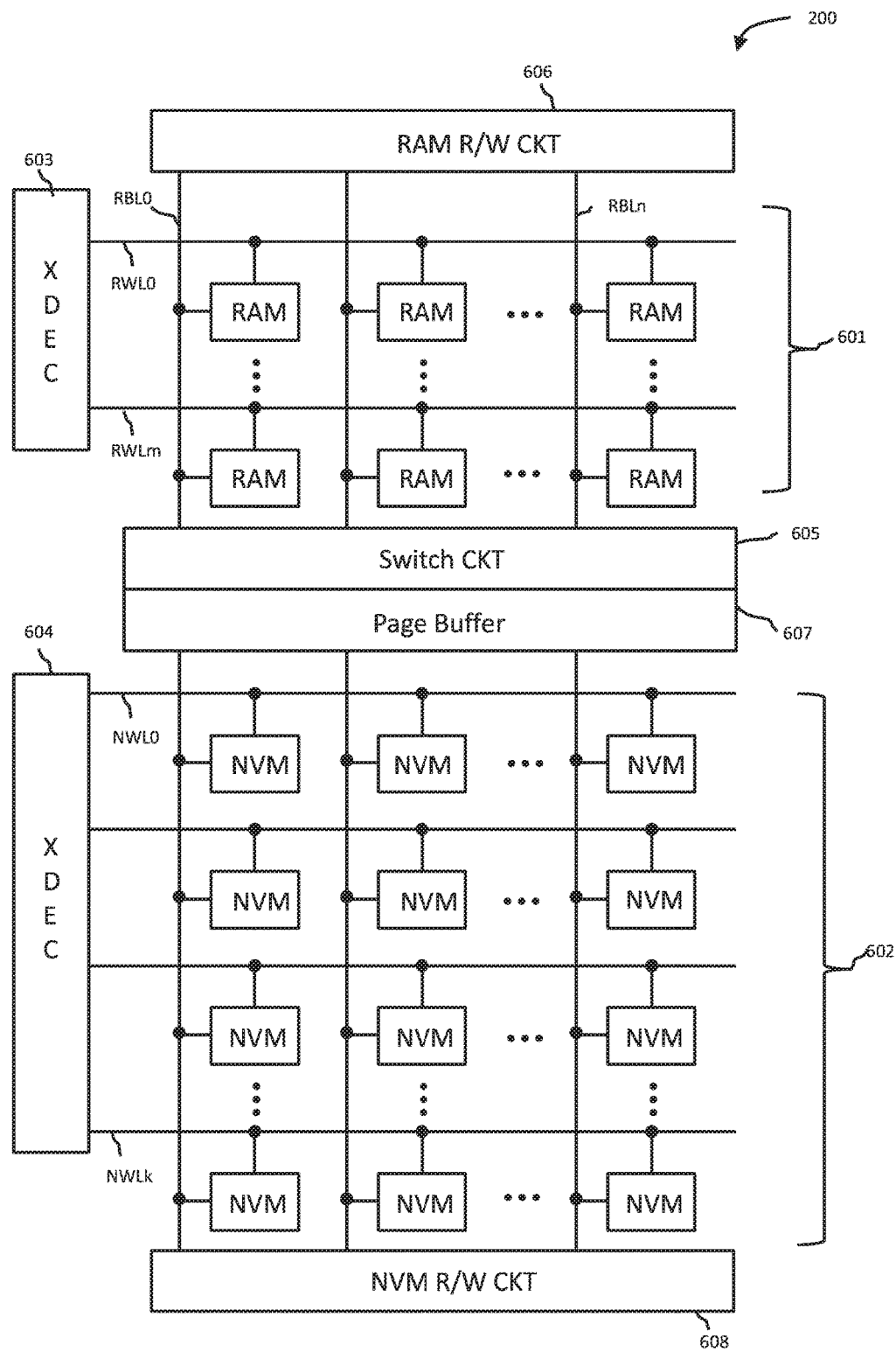
FIG. 2 is a block diagram illustrating an on-chip memory ("OCM") device containing both NVM and RAM in accordance with one embodiment of the present invention.

FIG. 2 is a block diagram 200 illustrating an OCM device containing both NVM and RAM in accordance with one embodiment of the present invention. Diagram 200 shows detailed array architecture of OCM device that contains two memory arrays, RAM 601 and NVM 602. RAM 601 contains multiple cells arranged in word lines ("RWL0-RWLm") and bit lines ("RBL0-RBLn"), and NVM 602 contains multiple cells arranged in word lines ("NWL0-NWLk") and bit lines ("NBL0-NBLi"). In one aspect, RAM 601 and NVM 602 have different number of word lines and bit lines. RAM and NVM arrays have their own XDEC 603 and 604, respectively, to select the word lines independently. In one example, XDEC contains special functions such as multiple-WL selection and no-WL selection.

BLs of RAM 601 and NVM 602 arrays, in one embodiment, can be connected through switch circuit 605 and page buffer 607. While RAM 601 includes a read/write circuit 606 connected to its BLs, NVM 602 contains page buffer 607 used to connect to its bit lines. It should be noted that the page buffer such as buffer 607 can be located any location such as the top or the bottom of the NVM bit lines. NVM, in another embodiment, includes a read/write circuit 68 which is used to facilitate independent read and write operations to both RAM and NVM.

During operation, switch circuit 605, in one mode, is turned off to isolate RAM array from NVM array, and RAM 601 can performed read and write operations by R/W circuit 606. In another mode, all of the RAM word lines are turned off by RAM's XDEC 603 and switch circuit 605 is turned on, thus NVM 602 can be read and written by RAM's read/write circuit 606. In yet another mode, switch circuit 605 is turned on and all the NVM word lines are turned off by NVM's XDEC 604, and the selected RAM page's data can be transferred to the NVM's page buffer. In another mode, switch circuit 605 is turned off, and NVM page buffer 607 can perform write operation to a selected NVM page while RAM can still be read and written by RAM's read/write circuit 606 independently.

Figure 3A:
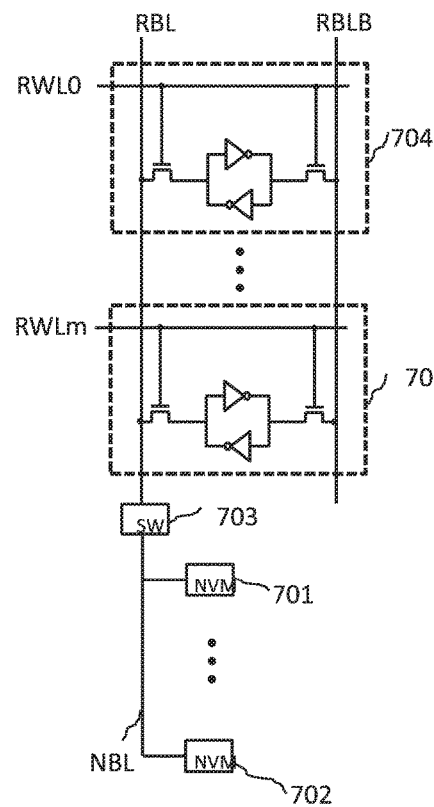
FIGS. 3A-3C are block diagrams illustrating layouts of OCM devices containing NVM strings and SRAM in accordance with one embodiment of the present invention.
Figure 3B:
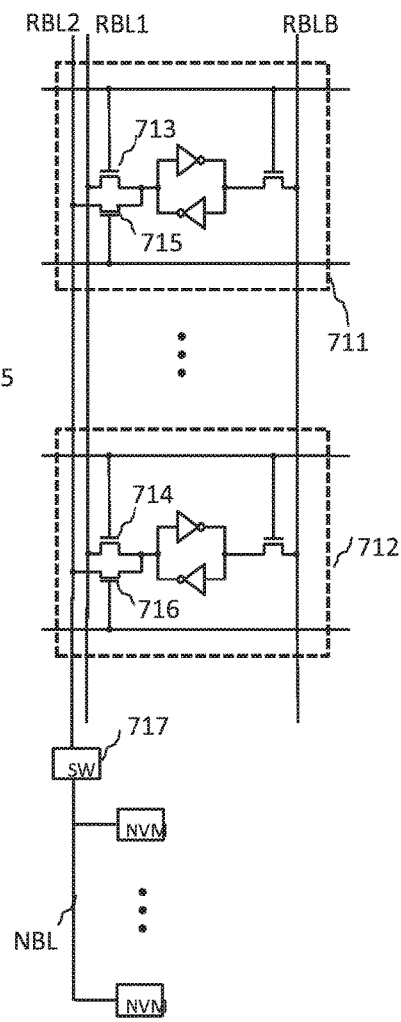
Figure 3C:
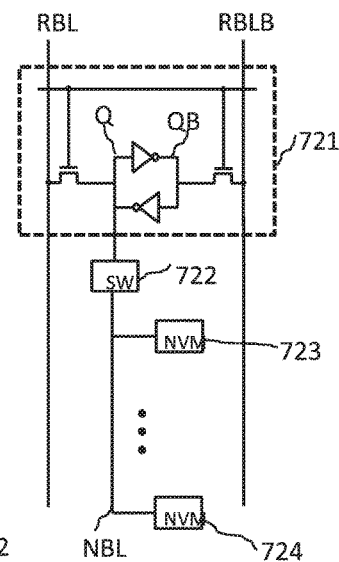

FIGS. 3A-3C are block diagrams illustrating layouts of OCM devices containing NVM strings and SRAM in accordance with one embodiment of the present invention. FIG. 3A to 3C show circuit layouts using SRAM cells as RAM and NVM strings using switch 703, 717, or 722. The BLs for SRAM cells such as SRAM cells 704-705, in one embodiment, are connected to BLs for NVM cells through several approaches. FIG. 3A shows a first approach allowing BLs NVM cells 701-702 ("NBL") to connect to BLs of SRAM cells 704-705 ("RBL") through switch circuit 703. FIG. 3B shows a second approach in which two ports of SRAM cells 711-712 are used to connect to RBL1 through select gates 713-714 and RBL2 through select gates 715-716. In one aspect, RBL2 is connected to the NVM's bit line (NBL) through switch circuit 717 which facilitates read and write operations between SRAM and NVM simultaneously. FIG. 3C shows another approach wherein the NVM's bit lines (NBL) is used to connect to SRAM cell 721 via internal node Q though switch circuit 722. It should be noted that other approaches are possible for coupling NVM cells with SRAM cells using BLs and switches, but such approaches and variations should not change the underlying concept of the exemplary embodiment(s) of the present invention.

FIGS. 4A-4B illustrate chip layouts of OCM device showing SRAMs and NVMs in accordance with one embodiment of the present invention. FIGS. 4A-4B show OCM layout organized in various RAM/NVM array arrangements. For example, FIG. 4A depicts a BL for NVM ("NBL") and a BL bar ("NBLB") wherein NBL and NBLB are connected to both sides RBL and RBLB. A switch circuit driving by signal 0 ("S0") is used to manage the connection between NBL, NBLB, RBL, and RBLB. In one example, the switch circuit is structured by one or more NMOS transistors. In operation, SRAM cell is able to store complementary data, Q and QB (Q-bar) to two NVM cells and also able to load data stored in both NVM cells into the SRAM cell Q and QB sides. Note that using double NVM cells to backup SRAM data can enhance reliability in SRAM.

In one example, the SRAM cell has wider Y-pitch than NVM cells due to its complexity of cell structure. For example, multiple NBL0-NBLj and NBLB0-NBNBj can be fit into an SRAM cell's pitch, and selected by the switch circuit's signals S0-Sj. An advantage of employing OCM device structured in FIG. 4B is that it enhances efficient arrangement in RAM and NVM layout which allows different cell pitches in a single array.

Figure 5A:
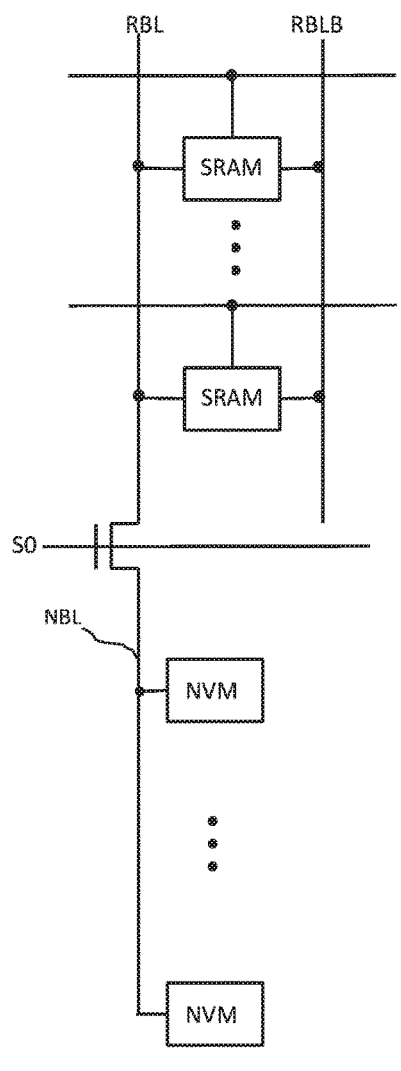
FIGS. 5A-5B and 6A-6B illustrate alternative chip layouts for OCM devices containing SPRAM and NVM in accordance with one embodiment of the present invention.
Figure 5B:
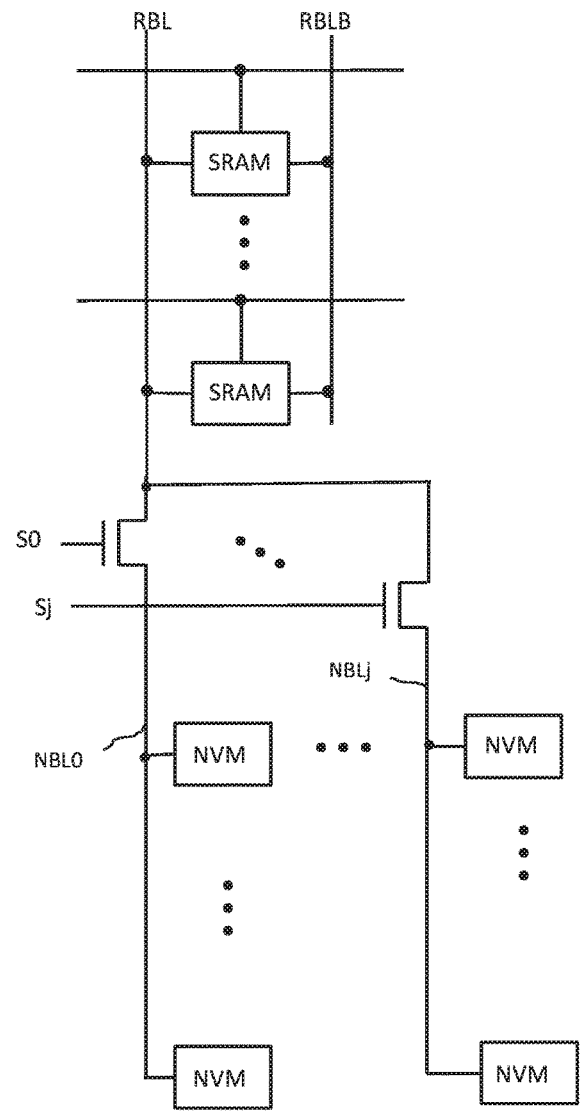

FIGS. 5A-5B and 6A-6B illustrate alternative chip layouts for OCM devices containing SPRAM and NVM in accordance with one embodiment of the present invention. FIG. 5A shows multiple SRAMs and NVMs connected by an NBL. The NBL is connected to a single side of RBL via a switch. FIG. 5B illustrates a scenario in which the SRAM cell pitch is larger than NVM cell pitch. In this layout, multiple BLs such as NBL0-NBLj are connected to one RBL through the selection of control signals S0-Sj via a set of switches or transistors. To store data in one SRAM cell to one NVM cell, it can reduce the NVM array area to one half compared to a traditional backup method. However, because there is only one NVM cell per bit, it needs to be fully turned on or off to decide the data. Note that during erase and program operations, enough time shall be taken to fully spread the on-cell and off-cell's Vt.

Figure 6A:
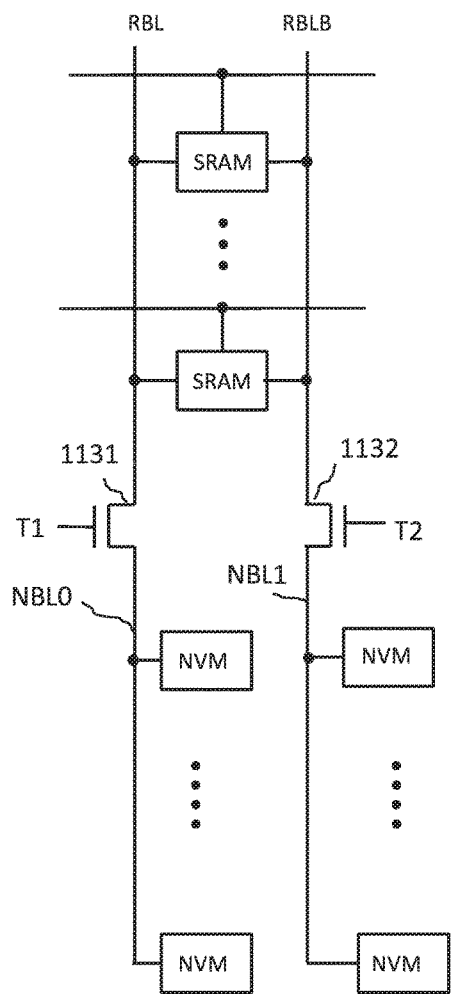
Figure 6B:
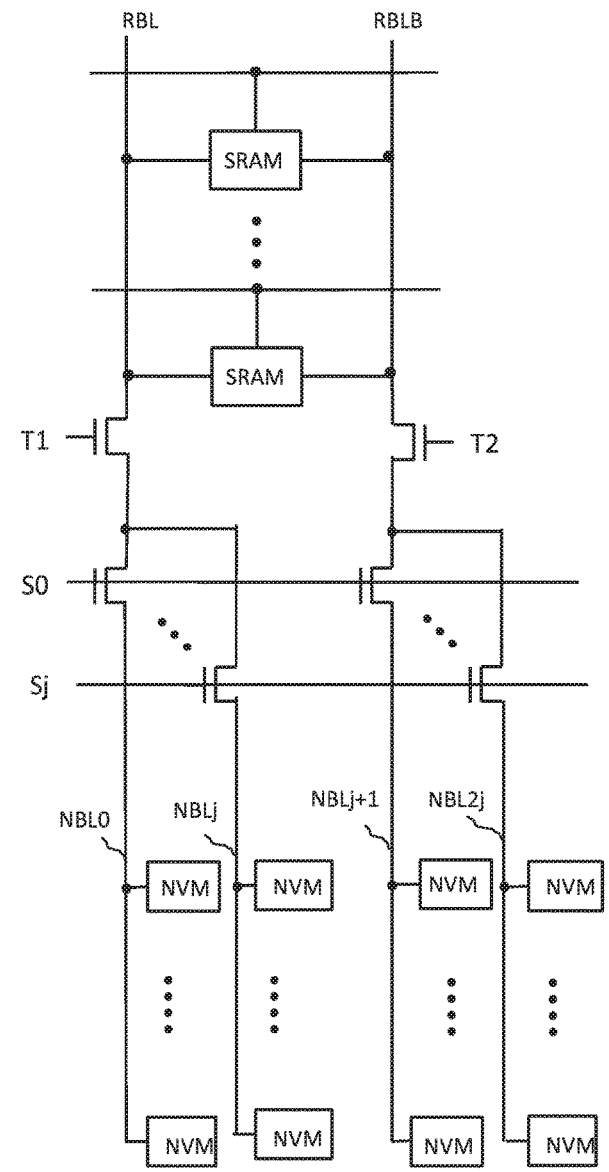

FIG. 6A shows an alternative configuration of OCM device wherein RBL and RBLB are connected to NBL and NBLB through switch circuits 1131-1132, respectively. FIG. 6A is similar to FIG. 4A except that FIG. 6A uses separate switches T1 and T2 to control the connection between SRAM and NVM strings. To store SRAM data to an NVM cell via NBL0, T1 goes high and T2 goes low which will connect RBL to NBL0 while separating RBLB from NBL1. The data at Q side of SRAM cell is then written to an NVM cell. To store SRAM data to NBL1, T1 goes high and T0 goes low which connects RBLB to NBL0. The data at the QB side of SRAM cell is programmed to the NVM cell. Note that although the data written to NBL0 and NBL1 are from SRAM's Q and QB sides, the data at Q and/or QB of SRAM cell can also be read. FIG. 6B shows another embodiment of OCM device. FIG. 6B, which is similar to FIG. 4B except the addition of T1 and T2 on RLB and RBLB. Note that when the SRAM cell's pitch is wider than the NVM cell's, extra S0-Sj signals are used to select the multiple NBLs.

In one example, an NVM array includes multiple page buffers to hold the data from the RAM during write operation. The SRAM can load the data into the page buffers and then switch off the switch circuit to isolate the SRAM from NVM. After switching off, the SRAM can be freely accessed while NVM is still being written by the page buffers.

Figure 7:
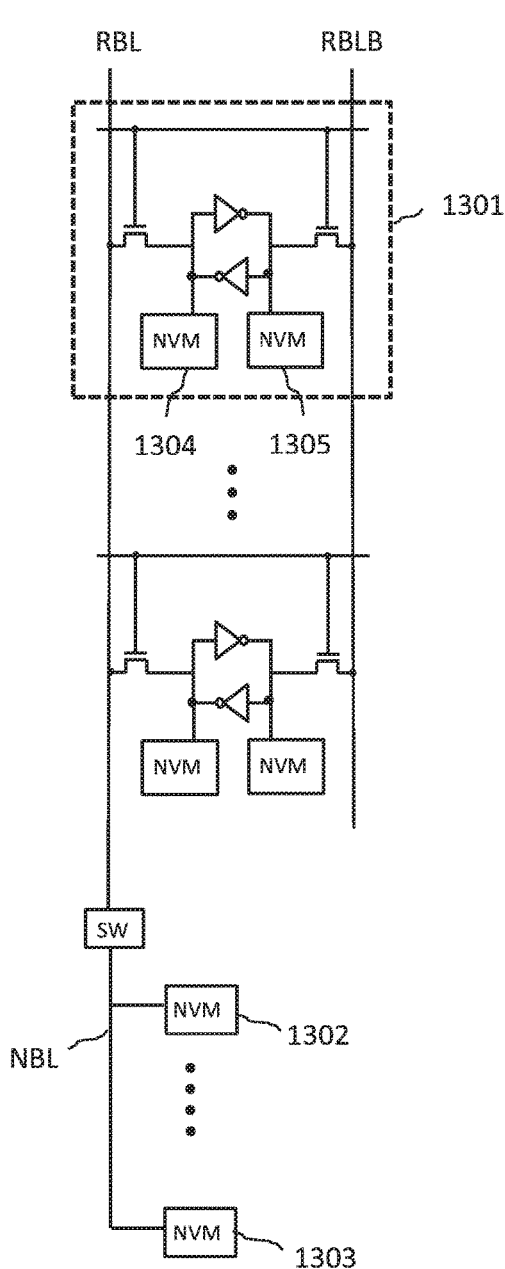

FIG. 7 is a block diagram illustrating an OCM device containing RAM and NVM cells for backup as well as data storage in accordance with one embodiment of the present invention. In one aspect, RAM includes a fast backup function capable of writing entire data stored in RAM into NVM cells during an emergency power loss. For example, NVRAM cell 1301 is coupled to NVM cells 1304-1305 for backup process and NVM array 1302-1303 for data storage. During an emergency power loss, the RAM's data can be quickly written to the associate NVM cells 1304-1305. Advantage of employing both NVM cells 1304-1305 and NVM array 1302-1303 is to enhance overall data integrity.

While NVM back cells such as cells 1304-1305 are used to back up the RAM data, NVM arrays 1302-1303 are used for storing data in an on-chip nonvolatile memory.

Figure 8:
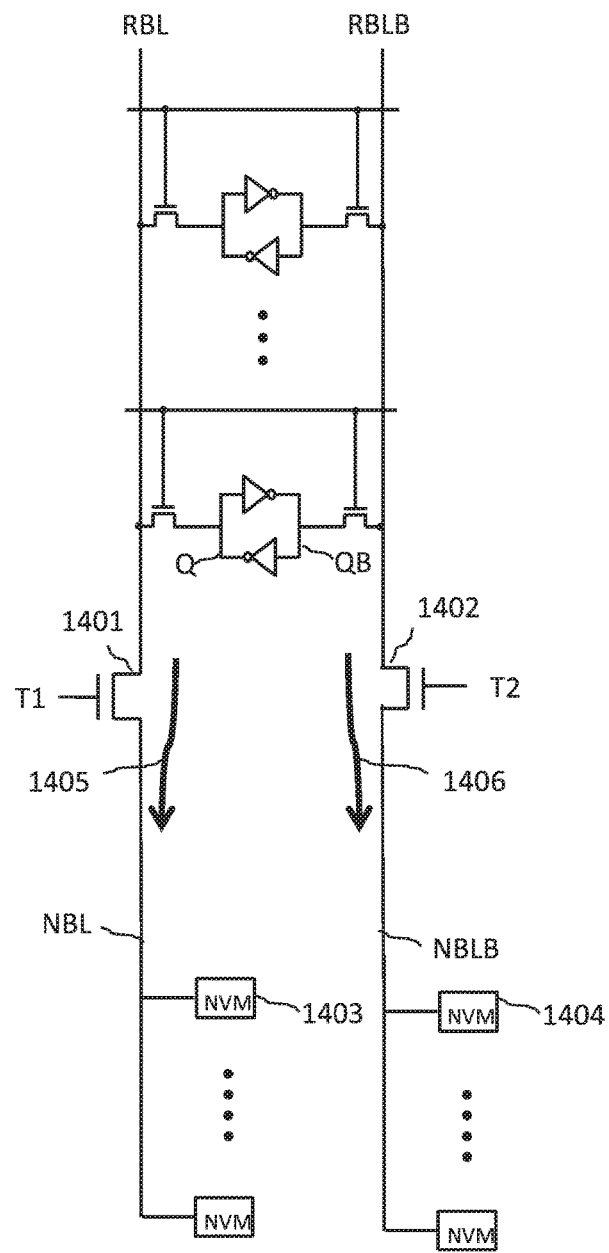

FIG. 8 is a block diagram illustrating an OCM device containing RAM and NVM cells in accordance with one embodiment of the present invention. FIG. 8 shows an exemplary logic circuit capable of performing an emergency data backup function. During an emergency power loss, the data in the selected RAM pages are backed up in NVM cells in NVM array. In a normal operation, one of switch circuit's control signals T1-T2 will be turned on. For example, when T1 is turned on, it will write the data from the selected SRAM cell to NVM cell 1403 via NBL, as shown in arrow 1405. Similarly, when T2 is turned on, it will write the data from the selected SRAM cell to NVM cell 1404 via NBLB, as shown in arrow 1406. During an emergency power loss, both T1 and T2 are turned on, and the data at Q and QB of the selected SRAM cells are applied to the NBL and NBLB at the same time. The selected NVM word line will be applied with the program voltage to program the complementary data into the cells 1403-1404 simultaneously. It should be noted that the selected NVM word line can be a special word line dedicated for this emergency backup function. T1 and T2 facilitate the data storage from SRAM to NVM in one shot. When the system is power-on again, the data can be read back or recovered from the NVM cells back to SRAM cells.

FIG. 9 is a block diagram illustrating an OCM device containing RAM and NVM cells in accordance with one embodiment of the present invention. FIG. 9 shows an alternative embodiment of the emergency data backup function using NVM cells. FIG. 9 is similar to FIG. 8 except that the NVM strings are coupled to Q or QB of SRAM cell instead of select gates. RAM, in one example, is divided into multiple pages, and each cell in the page connects to a NBL and a NBLB. During a normal operation, the switch circuit's control signals T1 and T2 turn on one of switches 1411 or 1412. For example, when T1 is turned on, the data at Q of SRAM is written into NVM cell 1413 via NBL, as shown in arrow 1415. When T2 is turned on, the selected data at QB is programmed into NVM cell 1414 via NBLB, as shown in arrow 1416. When a VDD detecting circuit detects an emergency power loss, both T1 and T2 are turned on to allow data at both Q and QB of SRAM cells to be stored in NVM cells 1413-1414 at the same time.

FIG. 10 is a clock waveform illustrating an OCM device containing RAM and NVM cells in accordance with one embodiment of the present invention. Vt(0) shows the programmed cell's voltage ("Vt") and Vt(1) shows the inhibit cell Vt. During a normal write operation, it has sufficient time (t1) to program cell's Vt(0) to the target value. During a read operation, the selected word line voltage, Vread, is applied to the cells to turn on the cells with Vt(1) while the cells with Vt(0) are turned off. During an emergency backup, the system may not have enough time to program the cells before the system shut down. It may only have shortened program time. The cell's Vt0 is not high enough to be read as off cell by Vread which is a reason to require two cells to store SRAM cell's complementary data. During recovery or recall, the WL voltage and Vrecall are applied to the word line and it might turn on both the cells if it is higher than the programmed cells' Vt(0). Due to the different resistance of the two cells, the correct data can be recovered by the SRAM cell. It should be noted that the Vrecall can be equal to or different from Vread, or ramping from low to high to get the best recall window.

NVM cells can be fabricated by various NVM technologies that are suitable to implement embodiments of the invention. The NVM, in one aspect, can be NAND based flash memory, NOR based flashed memory, phase-changing memory ("PCM"), EEPROM (erasable programmable read-only memory), or a combination of NAND, NOR, PCM, and/or EEPROM memory. To simplify forgoing discussion, NVM or NAND based flash memory may be used as an exemplary nonvolatile memory throughout the specification.

Figure 11:
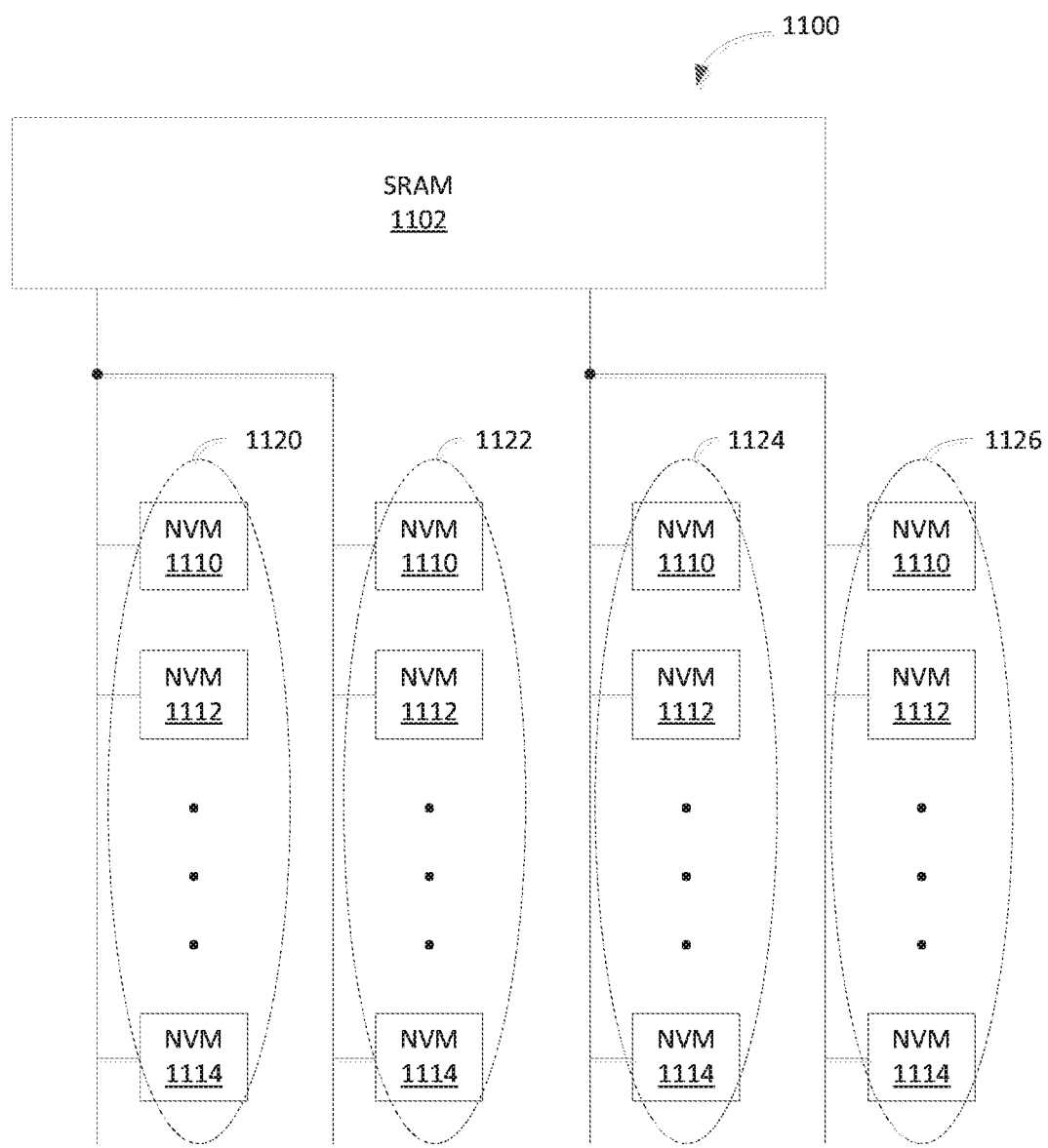
FIG. 11 is a block diagram illustrating a physical layout of OCM device containing SRAM and NVM strings in accordance with one embodiment of the present invention.

FIG. 11 is a block diagram 1100 illustrating a physical layout of OCM device containing SRAM and NVM strings in accordance with one embodiment of the present invention. Diagram 1100 illustrates that an SRAM array 1102 and an NVM array wherein the NVM array includes four NVM strings 1120-1126. Each NVM string includes multiple NVM cells 1110-1114. In one aspect, the width of SRAM circuit can be similar or equivalent to the total width of 4 to 32 NVM strings depending on the NVM technologies. In one embodiment, a portion of NVM strings 1120-1126 are allocated for emergency backup while another portion of NVM strings 1120-1126 are used for data storage. In one example, the data stored in NVM strings 1120-1126 can be automatically stored or transferred to the off-chip NVM devices such as solid state drive (SSD) or NVM database.

Figure 12:
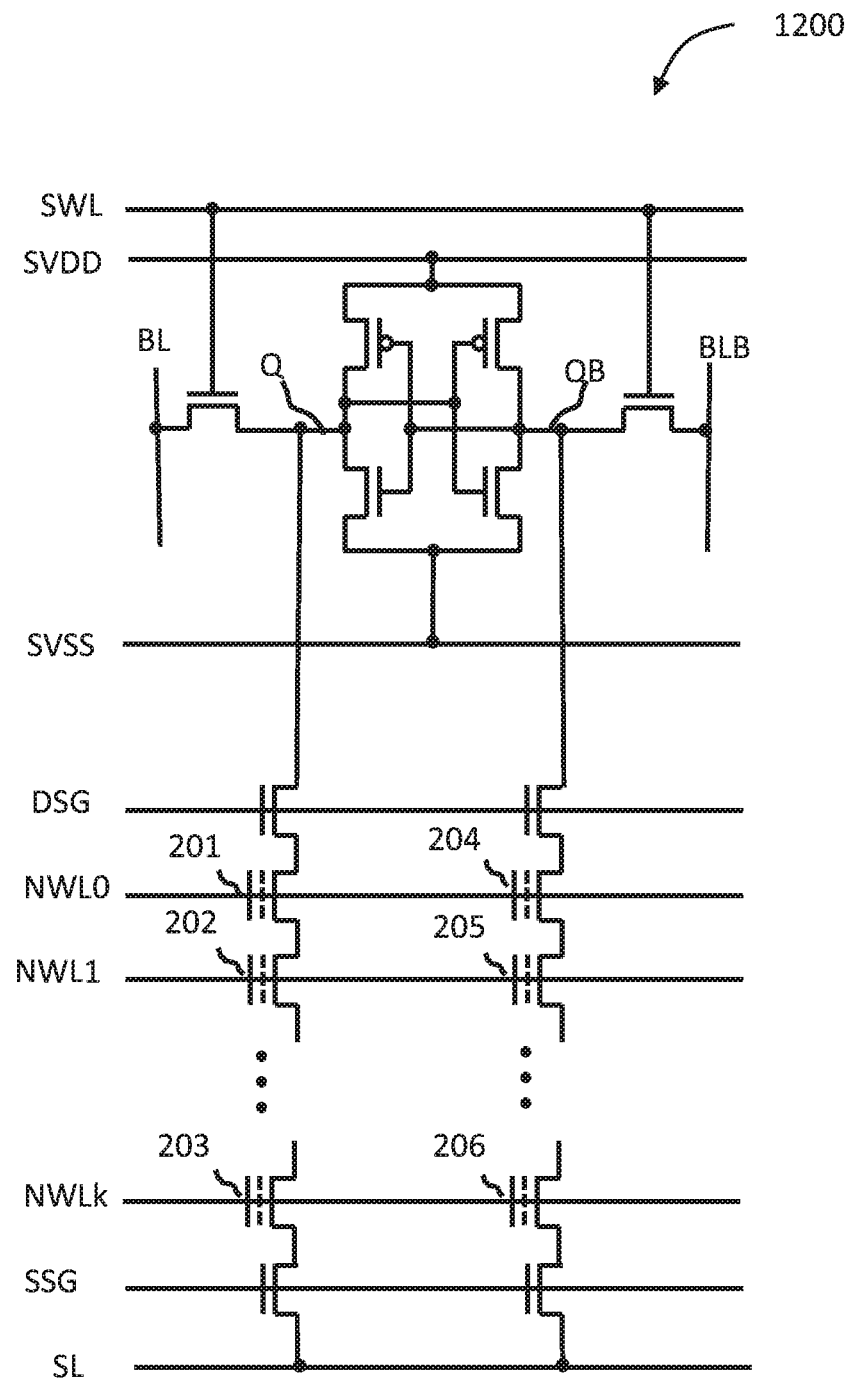
FIGS. 12-15D are diagrams showing SRAM and NVM circuits in accordance with one embodiment of the present invention.

FIG. 12 is a circuit diagram 1200 showing an SRAM and NVM circuits in accordance with one embodiment of the present invention. Diagram 1200 illustrates a SRAM cell and two NVM strings, a drain select gate ("DSG"), a source select gate ("SSG"), and a source line ("SL"). NVM strings contain multiple NVM cells 201-206 capable of storing data persistently. The data stored in the SRAM cell, in one embodiment, can be written to the NVM cell during data storage as well as emergency power loss. The data stored in the NVM cell can also be read to the SRAM cell. It should be noted that the underlying concept of the exemplary embodiment(s) of the present invention would not change if one or more circuits (or connections) were added to or removed from diagram 1200.

In one aspect, DSG can be used to facilitate MPS process since DSG can switch connection between SRAM and NVM strings. During an operation, the data stored in SRAM can be transferred to a NVM string when DSG is on. While NVM string is being programmed, the data in SRAM can be reloaded when DSG is off. The new data in SRAM can be loaded to another NVM string while the first NVM string is still being programmed. Because SRAM is operating in microseconds while NVM is operating in milliseconds.

An advantage of using OCM device having both SRAM and NVM is that it can facilitate MPS process. Also, during an emergency power loss, the data in SRAM can be backed up at NVM cells using DSG controlling signals. The backup data can be subsequently recovered or recalled from NAND cells to SRAM cell. Note that NVM cells 201-206 can be charge-trapping cells (SONOS), floating-gate cells, split-gate cells, or any other type of NVM cells.

Figure 13:
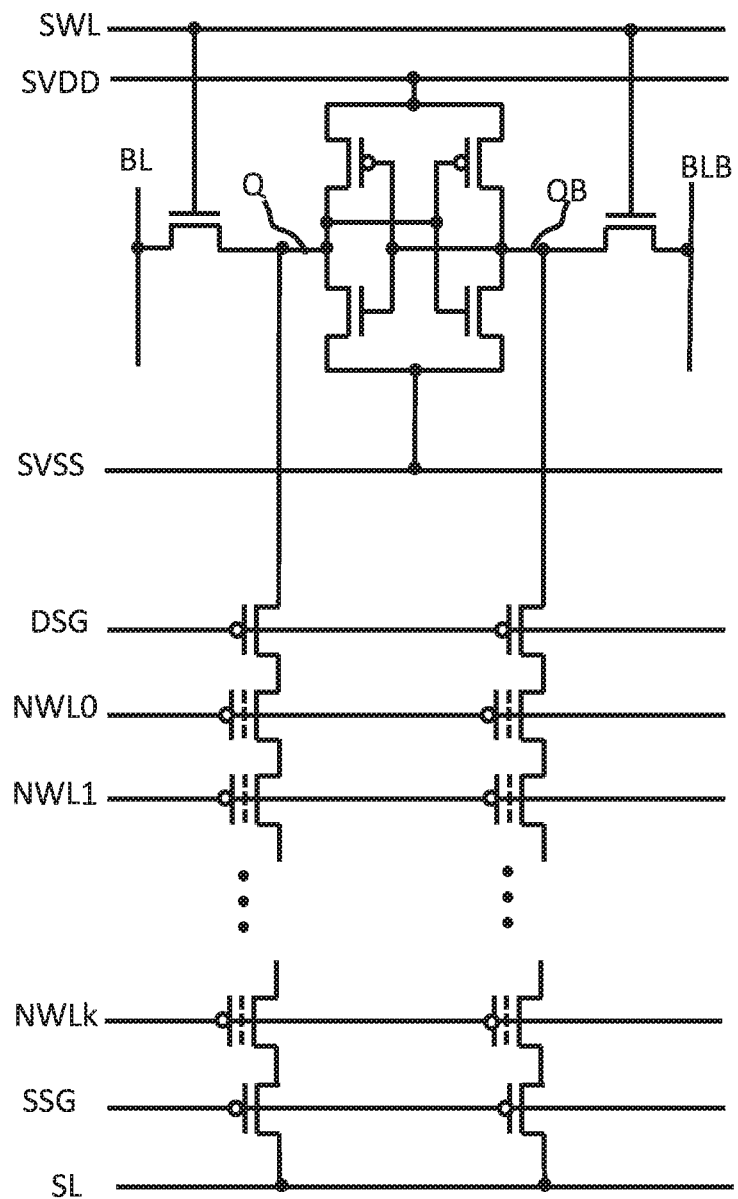

FIG. 13 is a diagram showing SRAM and NVM circuits in accordance with one embodiment of the present invention. FIG. 13 is similar to FIG. 12 except that FIG. 13 uses NMOS or PMOS cells.

Figure 14:
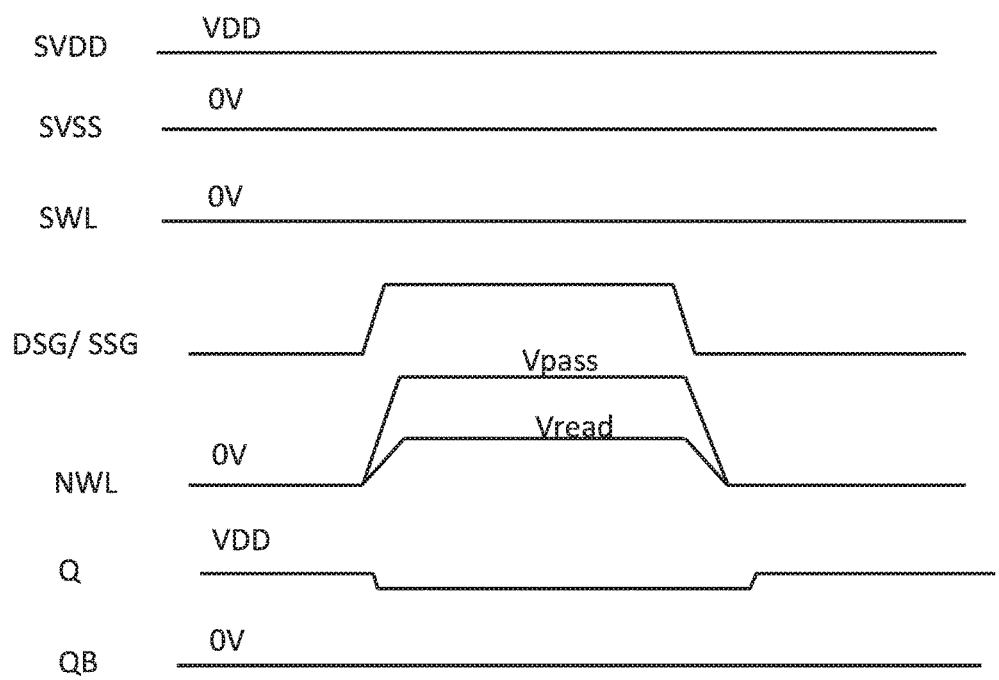

FIG. 14 is a waveform illustrating SRAM and NVM circuits in accordance with one embodiment of the present invention. FIG. 14 shows the waveform of recovering or recall backup data from NAND cells or NVM cells shown in FIG. 12. Upon applying DSG and SSG with VDD, SL with 0V, selected NVM cell is read based on the selected NWL voltage Vread. The Vread is a voltage between on-cell and off-cell's threshold voltage ("Vt"). The unselected NWLs are applied with a voltage, Vpass, that is higher than the off-cell's Vt. It should be noted that the on-cell's current is low and drives lower SRAM's node, Q. Low voltage associated with NVM makes difficult to flip the SRAM cell during recovery process. In order to recall the NAND cell's data, the SRAM cell's powers are connected to SVDD and SVSS instead of VDD and VSS. During recall, either SVDD or SVSS or both are floating, and the SL is applied with proper voltage such as 0V or VDD, depending on which SVDD or SVSS is floating. This condition will allow the NAND cell's small current to cause voltage difference between Q and QB. The SVDD and SVSS voltages can be restored to 'develop' the difference into full VDD and VSS range. Note that the NAND cell's data can be recalled to the SRAM cell correctly even though the driving current for NVM is approximately 1 uA or less.

Figure 15A:
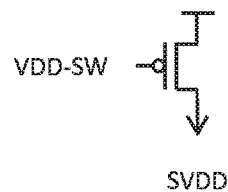
Figure 15C:
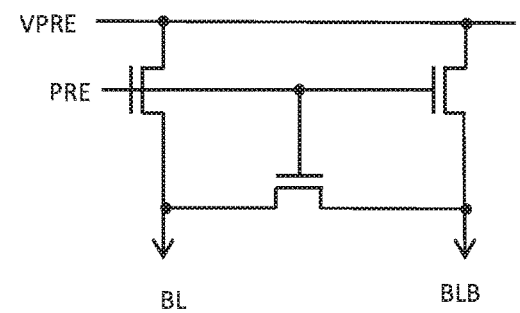
Figure 15B:
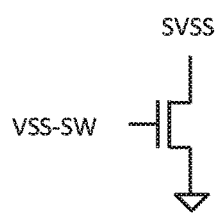
Figure 15D:
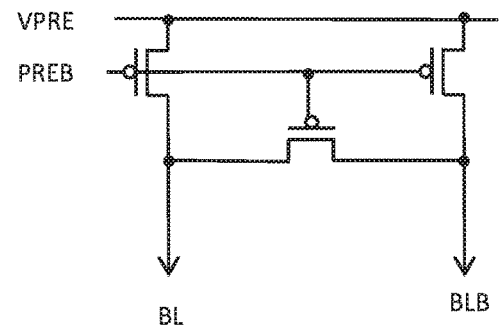

FIGS. 15A-15D are diagrams showing control circuits in accordance with one embodiment of the present invention. FIG. 15A shows an exemplary circuit capable of controlling SVDD. The SVDD can be connected to a large-size PMOS. When the signal VDD_SW goes low, SVDD is applied with VDD. When VDD_SW signal goes high, it turns off the PMOS to floating the SVDD. FIG. 15B shows an example circuit to control the SVSS. The SVSS can be connected to a large-size NMOS. When the signal VSS_SW goes high, SVSS is applied with 0V. When VSS_SW signal goes low, it turns off the NMOS to floating the SVSS. SRAM cell's BL and BLB are configured to be pre-charged to certain voltage during the recall. FIGS. 15C and 15D show two examples of pre-charge the BL and BLB.

Note that the circuits shown in FIG. 15A to 15D are for illustrative only. There are other ways to implement the circuits.

Figure 16:
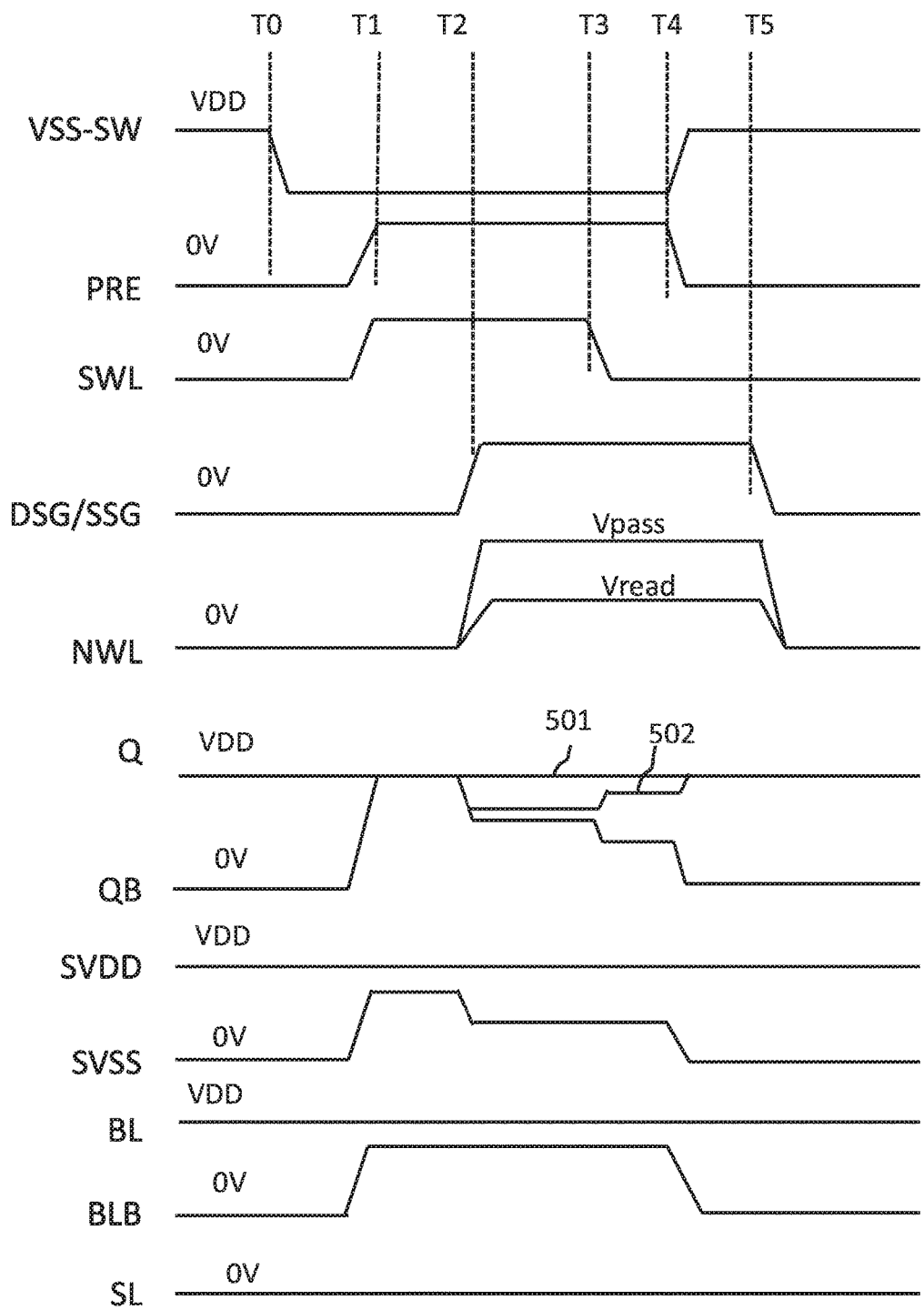
FIG. 16 is a waveform illustrating an OCM device having both SRAM and NVM in accordance with one embodiment of the present invention.

FIG. 16 is a waveform illustrating OCM device having both SRAM and NVM in accordance with one embodiment of the present invention. The waveform shows an operation waveform of recalling data in NAND cell back to SRAM cell. For example, assuming SRAM cell's Q and QB sides are initially at VDD and 0V, respectively, the selected NAND cells in Q and QB sides are on-cell and off-cell, respectively. A successful recall shall pull Q to 0V and QB to VDD to flip the SRAM cell.

FIG. 16 shows operation waveforms wherein the SVDD is VDD and the SVSS is floating during the recall. At T0 time, the VSS_SW goes low to floating at the SVSS. At T1, PRE and SWL go high to pre-charge both the BL and BLB, and Q and QB to VDD. At T2, the NAND cells' DSG and SSG go high. The selected and unselected NWL are applied with Vread and Vpass, respectively. The SL is applied with 0V which should drive Q to a voltage lower than QB. At T3, SWL goes low. At T4, VSS_SW goes high to apply 0V to SVSS, thus Q and QB starts to develop into full VDD and 0V range. At T5, DSG, SSG, and NWL all go to 0V. The recall operation is finished. Note that even if the off-cell in the QB side is not completely turned off and has leakage current, it still can work because the dip as indicated by numeral 501 shows that the cell in QB side is completely turned off. The wave change 502 shows the case that the cell has leakage.

Figure 17:
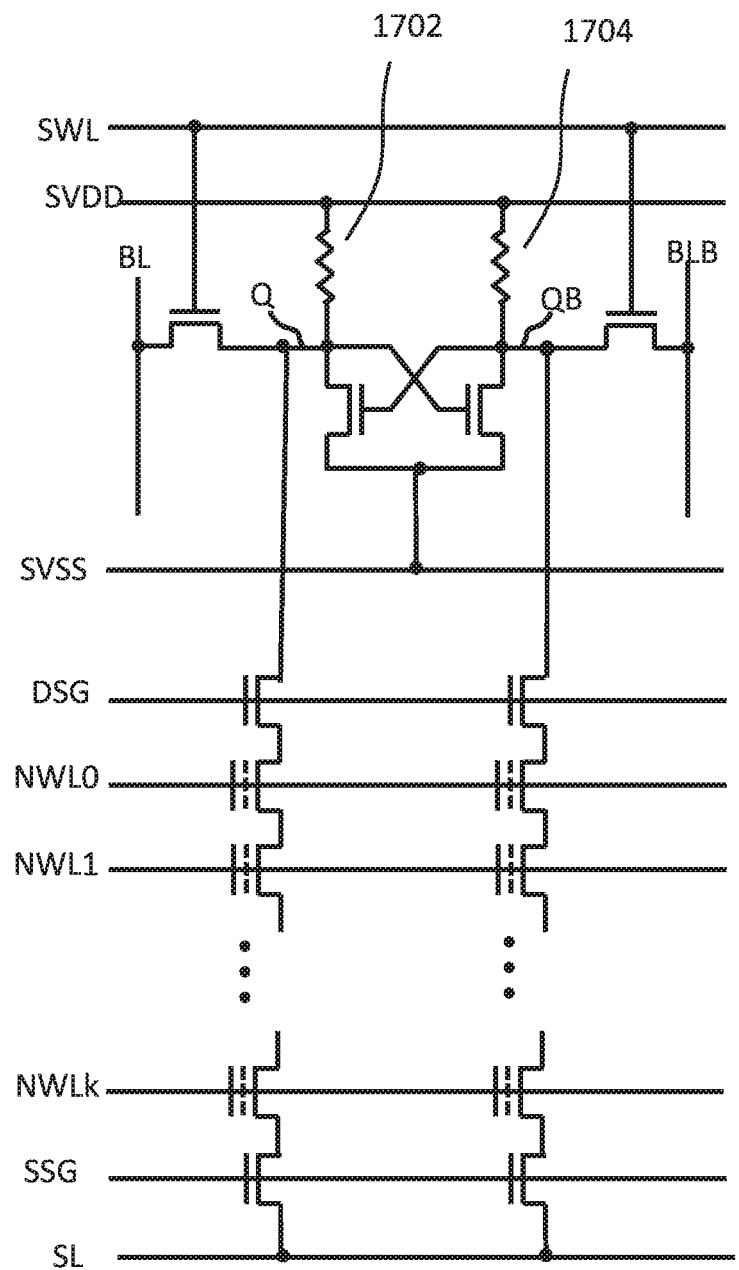

FIG. 17 is a circuit diagram illustrating alternative OCM device layout having SRAM and NVM in accordance with one embodiment of the present invention. FIG. 17 is similar to FIG. 12 except that FIG. 17 uses 4T SRAM as RAM cell. In one embodiment, the SRAM cell contains two poly resistors 1702-1704 which can reduce cell size although it may require the extra semiconductor process steps.

FIG. 18A is a table illustrating erase and program conditions in OCM device in accordance with one embodiment of the present invention. FIG. 18A shows an example of erase and program conditions for the NAND cells. In Erase 1 condition, the selected NWL is applied with a negative high voltage (VNN) such as −10V for example. VNN will cause 'Fowler-Nordheim Tunneling' mechanism to extract electrons from the charge storage layer, such as ONO or floating gate, to reduce the cells' Vt. In another Erase 2 condition, the selected NWL is applied with a negative medium high voltage (Vmn) such as −5V for example. The SL is applied with a positive medium high voltage (Vmp) such as 5V for example. The SSG and unselected NWL are applied with a voltage higher than Vmp to pass the SL voltage to the selected cell. The voltage higher than Vmp will cause 'Fowler-Nordheim Tunneling' mechanism to occur in the junction-to-gate overlapped edge to extract electrons from the charge storage layer to reduce the cells' Vt.

In Program condition, the DSG is applied with VDD that will pass SRAM cell's Q and QB's voltages to the NAND cells. The SSG is turned off. The selected NWL is applied with a positive high voltage (VPP) such as 10V, for example. The unselected NWL are applied with a positive medium high voltage (Vmp) such as 5V, for example. These voltages will couple the channel regions of the NAND cells to a medium high voltage such as 4V-5V, called channel-self-boosting. For Q is VDD, the channel will remain at that voltage due to the DSG becomes reverse-biased. This will cancel the electric field of the selected NWL to prevent the cell from programming. For Q is 0V, the channel will be discharged to 0V due to its DSG is turned on, thus the selected cell will be programmed. The high voltage on the selected NWL will cause 'Fowler-Nordheim Tunneling' mechanism to inject current into the charge storage layer to increase the cell's Vt.

FIG. 18B is a circuit diagram illustrating an OCM device in accordance with one embodiment of the present invention. FIG. 18B shows two NAND strings have separated DSG1 901 and DSG2 902. Multiple DSGs allow two or more NAND strings to store different data concurrently whereby the capacity of NAND memory is increased. During an operation, when program NAND string in Q side, DSG1 is turned on and DSG2 is turned off. Thus, the Q side cells' channel can be discharged to 0V or self-coupled depending on the data stored in Q. The QB side cells' channel will be all self-coupled for inhibit due to DSG2 is turned off. During recall, DSG1 is turned on so Q can be charged or not charged by SL voltage, depending on the selected NAND cell's data. With contrast, DSG2 is turned off so the QB side will not be affected by the NAND cells.

FIG. 18C is similar to FIG. 18B except that FIG. 18C has common DSG and separated SSG1 903 and SSG2 904. During programming, due to the DSG is common, both Q and QB data will be passed to the NAND strings. If the unselected side's data is 0V, it will cause the NAND cell to be programmed. After the data is passed to the NAND strings, DSG is turned off, and the unselected side's SSG is turned on to pass VDD to the NAND string from SL. When unselected SSG is turned off and the NWL can go to high voltages to start programming, the unselected NAND string will not be programmed. It should be noted that SL voltage can be higher than VDD to provide better program-inhibit effect. Note that the unselected SSG2 can remain on during the programming to provide the inhibit voltage from SL. During recall, only SSG1 or SSG2 is turned on so only one side's NAND cell will be recalled to the SRAM cell.

Figure 19A:
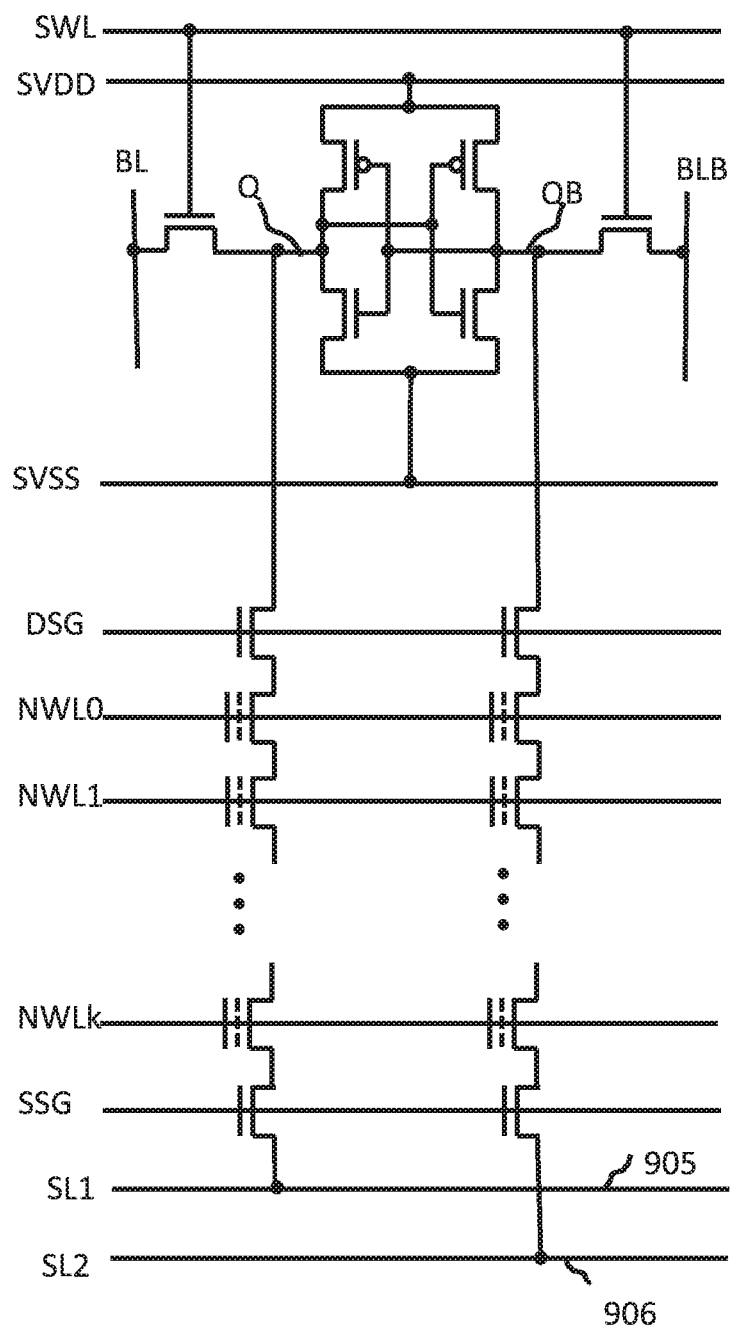
FIGS. 19A-20B are diagrams illustrating alternative OCM layout having SRAM coupled to multiple NVM strings in accordance with one embodiment of the present invention.

FIG. 19A is a circuit diagram illustrating alternative OCM layout in accordance with one embodiment of the present invention. FIG. 19A is similar to FIG. 18B except that FIG. 19A has common DSG and SSG and separated SL1 905 and SL2 906. During programming, assume Q side NAND cell is selected and DSG and SSG are, first, turned on. SL1 and SL2 are subsequently applied with different voltages. SL1 is applied with a lower voltage such as ½ VDD for example. When ratio with Q, it will become near 0V and near VDD if Q is 0V and VDD, respectively. With contrast, SL2 is applied with a higher voltage such as 2VDD for example. After ratio with QB, it will become near and higher than VDD for QB is 0V or VDD, respectively. When DSG and SSG are turned off and NWL are applied with high voltage, the cells in Q side will be program or not, depending their channel voltage. The QB side's cells will not be programmed due to their channel's higher voltage. During recall, the selected SL1 will be applied with the proper voltage described previously. With contrast, the unselected SL2 will be floating or applied with a proper voltage to prevent the QB being pulled up or down, depending on the conditions, to prevent it from affecting Q side's recall result.

Figure 19B:
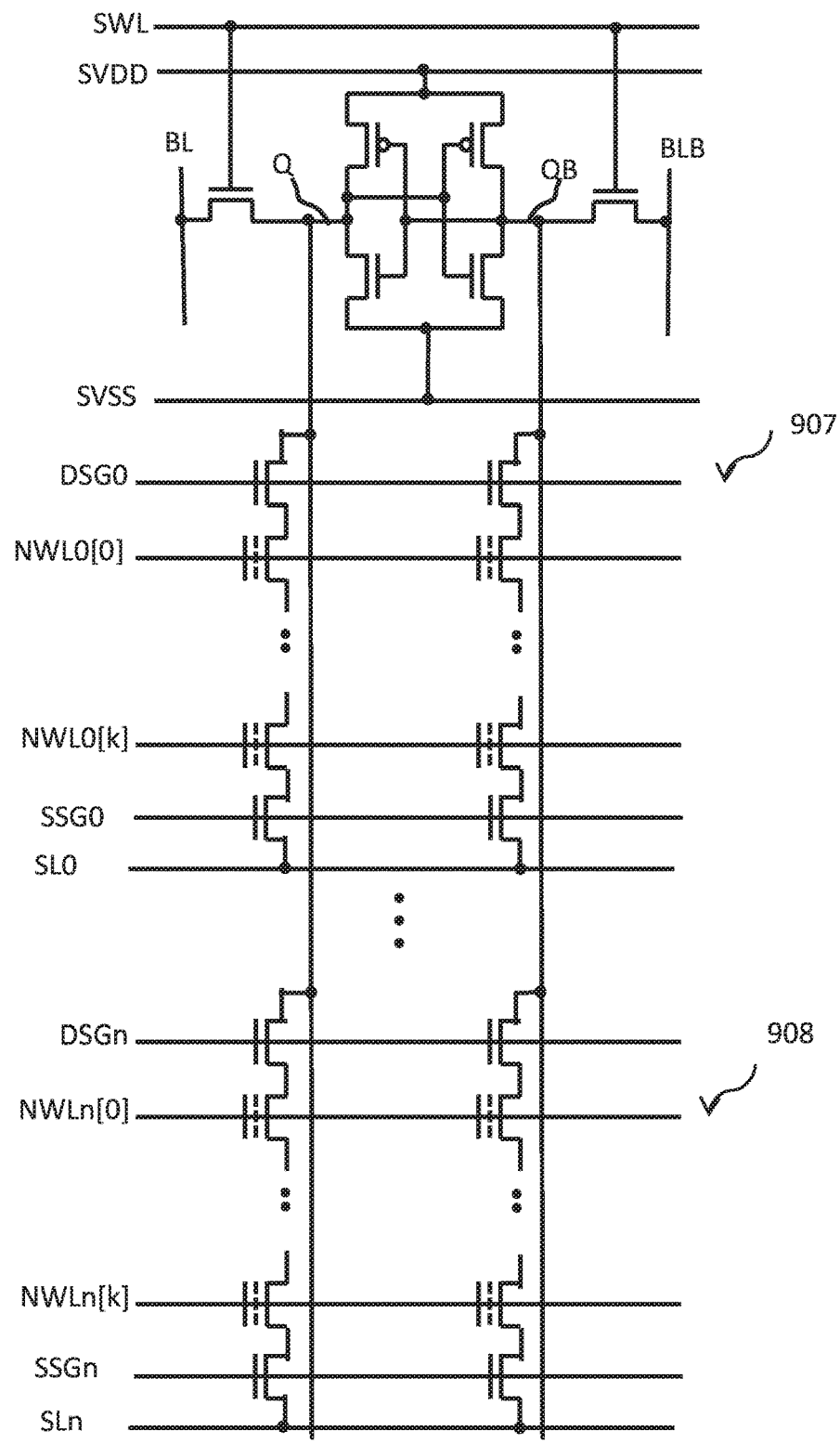

FIG. 19B is similar to FIG. 19A except that FIG. 19B includes multiple pages or strings of NVM or NAND memory. In this embodiment, each SRAM cell may connect to multiple NAND strings or pages such as NAND strings 907-908. Each string may contain its own DSG, SSG, and SL thus each string can perform program and recall independently.

Figure 20A:
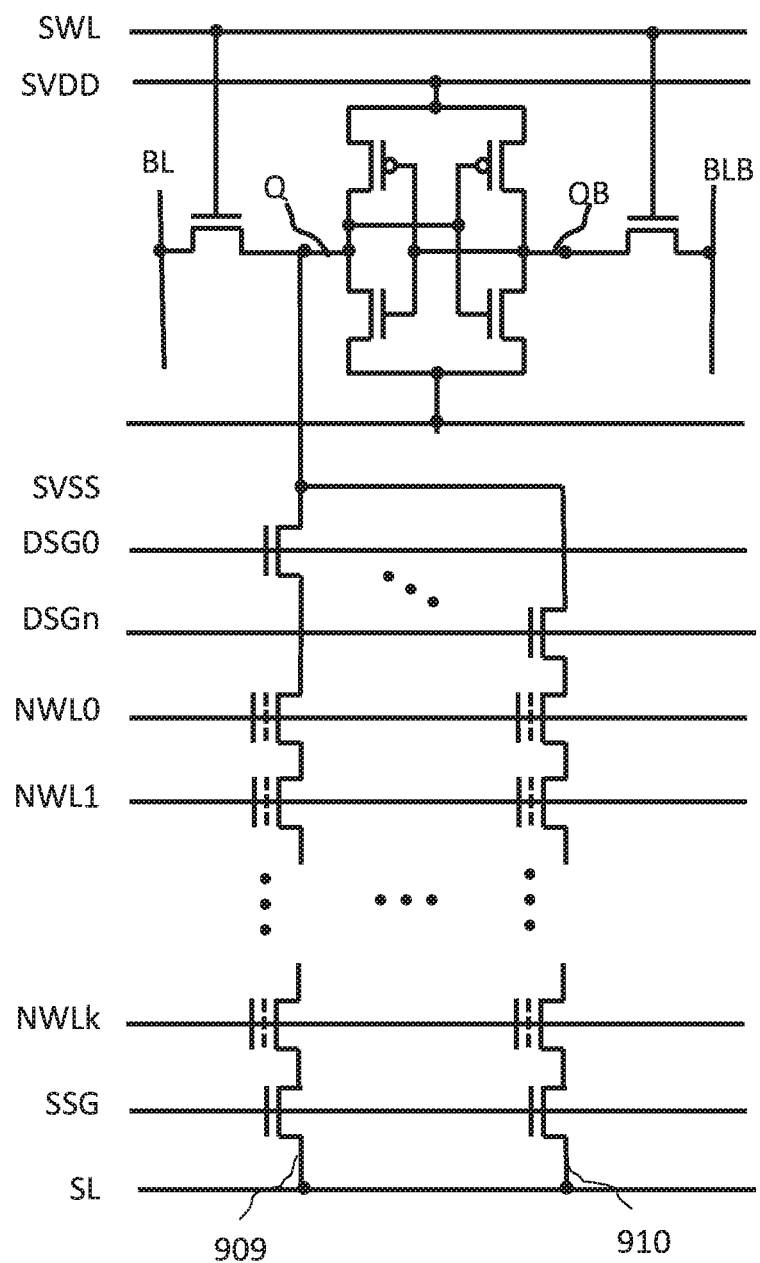

FIG. 20A is similar to FIG. 19A except that each SRAM cell shown in FIG. 20A may connect to multiple NAND strings 909-910 to a single node such as Q output terminal of SRAM. The strings may have different DSG0 to DSGn as shown, thus they can perform the programming and recall independently.

Figure 20B:
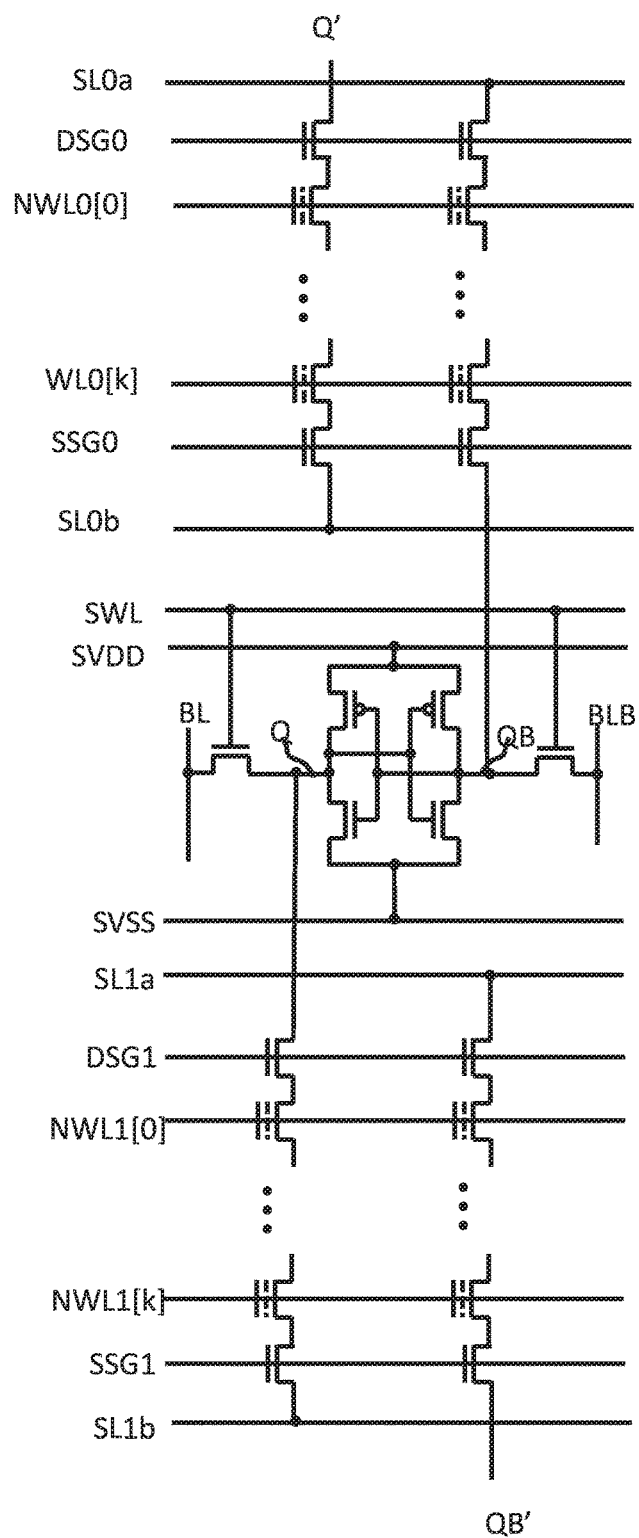

FIG. 20B is similar to FIG. 19A except that FIG. 20B using both Q' and QB' to connect to other SRAM cells. In this embodiment, the NAND string of the SRAM cell share the DSG, SSG, and NWL with the NAND string of other SRAM cell. Each NVM or NAND string uses different SL to perform programming and recovery independently.

Figure 21:
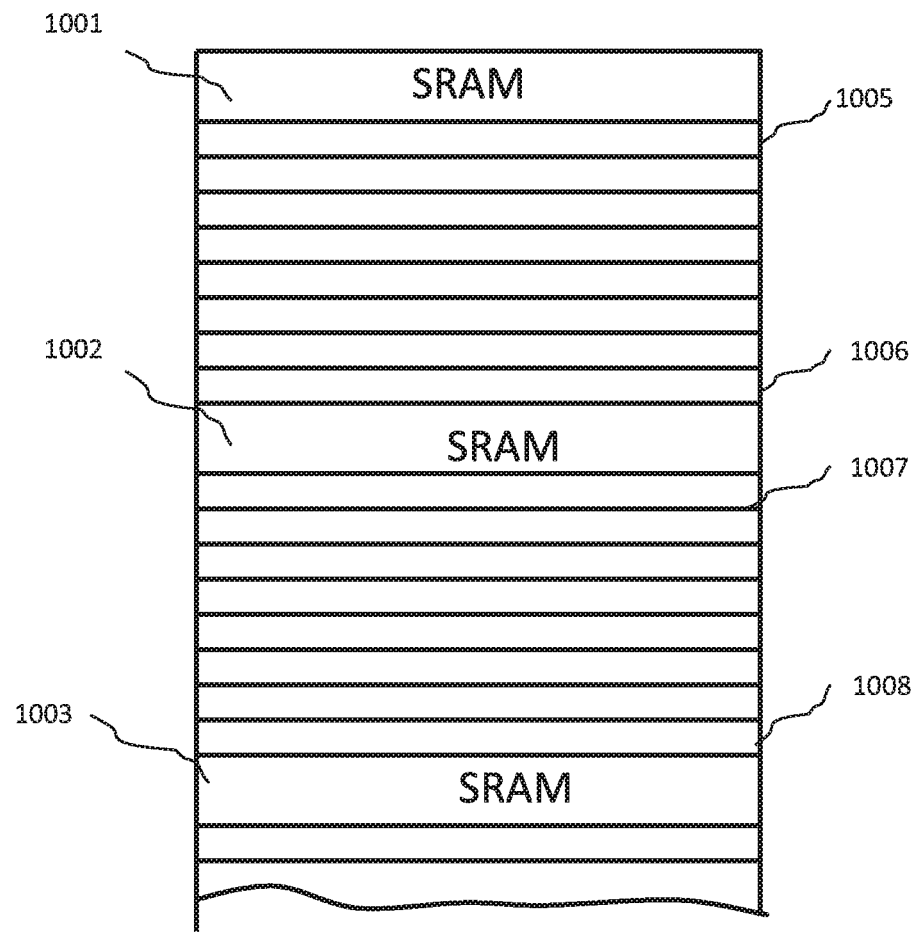
FIG. 21 is a diagram illustrating an alternative memory layout having multiple SRAM arrays and NVM arrays in accordance with one embodiment of the present invention.

FIG. 21 is a diagram illustrating an alternative memory layout having multiple SRAM arrays and NVM arrays in accordance with one embodiment of the present invention. FIG. 21 illustrates an array containing multiple SRAM pages 1001-1003. The first SRAM page 1001 is connected to multiple NAND pages 1005-1006 and second SRAM page 1002 is connected to multiple NAND pages 1007-1008. In one aspect, the array can have single-page, multiple-page, and all-page operations. In single-page operation, the selected SRAM page can write and recall the data to and from the selected NAND page. In multiple-page operation, multiple selected SRAM pages can write and recall the data to and from multiple selected NAND pages. In all-page operation, all the SRAM pages can write and recall the data to and from all the selected NAND pages.

The exemplary aspect of the present invention includes various processing steps, which will be described below. The steps of the aspect may be embodied in machine or computer executable instructions. The instructions can be used to direct a general purpose or special purpose system, which is programmed with the instructions, to perform the steps of the exemplary aspect of the present invention. Alternatively, the steps of the exemplary aspect of the present invention may be performed by specific hardware components that contain hard-wired logic for performing the steps, or by any combination of programmed computer components and custom hardware components.

Figure 22:
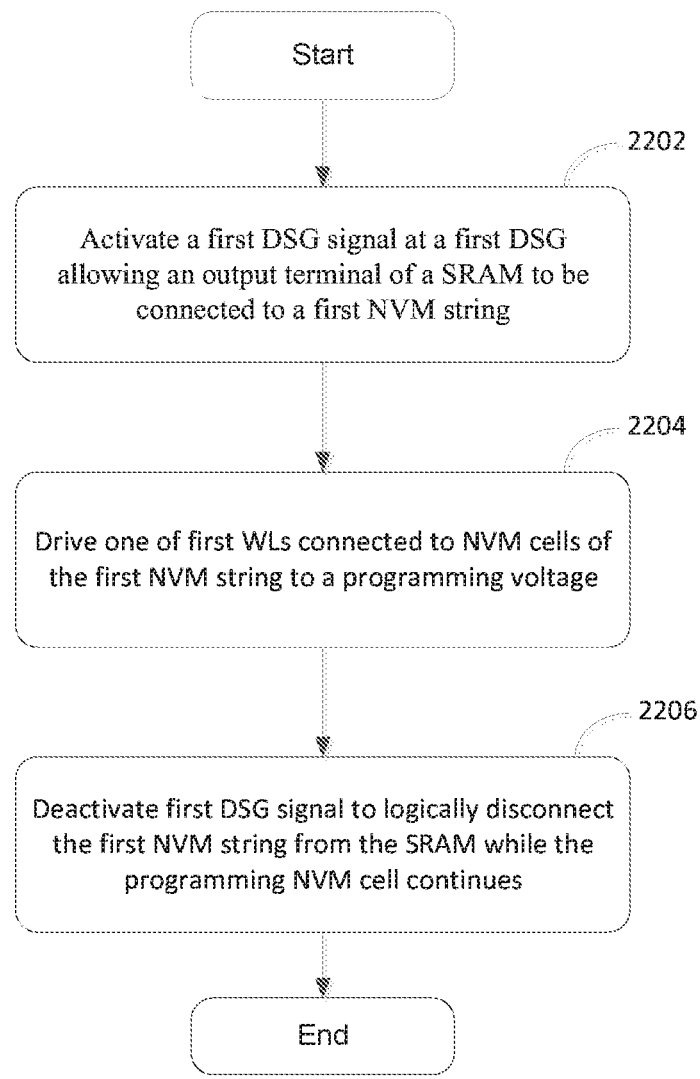
FIG. 22 is a flow chart illustrating a multiple-page programming scheme ("MPS") process able to enhance programming speed in accordance with one embodiment of the present invention.

FIG. 22 is a flow chart illustrating a multiple-page programming scheme ("MPS") process able to enhance programming speed in accordance with one embodiment of the present invention. At block 2202, a process capable of programming nonvolatile memory cell in an OCM device is able to activate a first DSG signal at a first DSG allowing an output terminal of a SRAM to be connected to a first NVM string. In one example, logically coupling a Q-terminal of the SRAM is logically coupled to a NAND based NVM string with NAND based nonvolatile memory cells.

At block 2204, after driving one of first WLs connected to NVM cells of the first NVM string to a programming voltage and driving remaining first WLs to pass voltages, the first DSG signal is deactivated at the first DSG at block 2206 to logically disconnect the first NVM string from the SRAM while the programming NVM cell in the first NVM string continues. In one embodiment, the process is capable of activating a second DSG signal at a second DSG coupled to the output terminal of the SRAM to connect a second NVM string to the SRAM. After driving one of second WLs connected to NVM cells of the second NVM string to a programming voltage and driving remaining second WLs to pass voltages, the second DSG signal is deactivated at the second DSG to logically disconnect the second NVM string from the SRAM while programming NVM cell in the first NVM string and programming NVM cell in the second NVM string continue.

Figure 23:
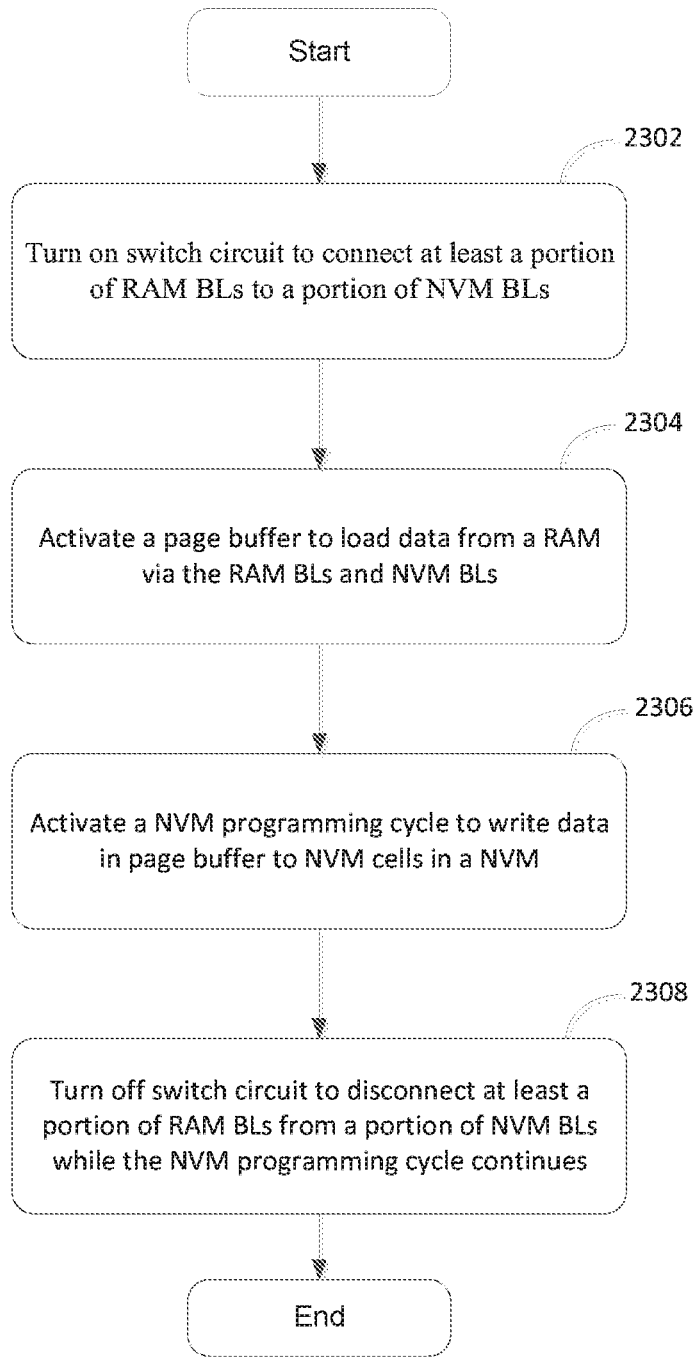
FIG. 23 is a flow chart illustrating another alternative example of an MPS operation able to store and backup data from SRAM to NVM in accordance with one embodiment of the present invention.

FIG. 23 is a flow chart illustrating another alternative example of an MPS operation able to store and backup data from SRAM to NVM in accordance with one embodiment of the present invention. At block 2302, a process for storing information in a memory device is capable of turning on switch circuit to connect at least a portion of RAM BLs to a portion of NVM BLs.

At block 2304, after activating a page buffer to load data from a RAM via the RAM BLs and NVM BLs, a NVM programming cycle, at block 2306 is activated to write data in the page buffer to a plurality of NVM cells in a NVM.

At block 2308, the process turns off the switch circuit to disconnect at least a portion of RAM BLs from a portion of NVM BLs while the NVM programming cycle continues. In one aspect, the process is able to receive information from a processing unit to the RAM while the NVM programming cycle continues. The process can also interrupt the NVM programming cycle when a data request to the NVM is received.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method for programming nonvolatile memory cell in a memory device, comprising:
    activating a first drain select gate ("DSG") signal at a first DSG allowing an output terminal of a static random-access memory ("SRAM") to be connected to a first nonvolatile memory string having at least two nonvolatile memory ("NVM") cells capable of storing two logic values;

driving one of first world lines ("WLs") connected to the nonvolatile memory cells of the first nonvolatile memory string to a programming voltage and driving remaining first WLs to pass voltages; and deactivating the first DSG signal at the first DSG to logically disconnect the first nonvolatile memory string from the SRAM while programming nonvolatile memory cell in the first nonvolatile memory string continues.

2. The method of claim 1, further comprising activating a second DSG signal at a second DSG coupled to the output terminal of the SRAM to connect a second nonvolatile memory string to the SRAM.

3. The method of claim 2, further comprising driving one of second WLs connected to nonvolatile memory cells of the second nonvolatile memory string to a programming voltage and driving remaining second WLs to pass voltages.

4. The method of claim 3, further comprising deactivating the second DSG signal at the second DSG to logically disconnect the second nonvolatile memory string from the SRAM while programming nonvolatile memory cell in the first nonvolatile memory string and programming nonvolatile memory cell in the second nonvolatile memory string continue.

5. The method of claim 1, wherein activating the first DSG signal at a first DSG further includes logically coupling a Q-terminal of the SRAM to a NAND based nonvolatile memory string with a plurality of NAND based nonvolatile memory cells.

6. A method for storing information in a memory device, comprising:

turning on switch circuit to connect at least a portion of random-access memory ("RAM") bit lines ("BLs") to a portion of nonvolatile memory ("NVM") BLs;

activating a page buffer to load data from a RAM via the RAM BLs and NVM BLs coupling to at least two NVM cells capable of storing two values;

activating an NVM programming cycle to write data in the page buffer to a plurality of NVM cells in an NVM; and turning off switch circuit to disconnect at least a portion of RAM BLs from a portion of NVM BLs while the NVM programming cycle continues.

7. The method of claim 6, further comprising receiving information from a processing unit to the RAM while the NVM programming cycle continues.

8. The method of claim 6, further comprising interrupting the NVM programming cycle when a data request to the NVM is received.

9. The method of claim 1, further comprising turning on switch circuit to connect at least a portion of random-access memory ("RAM") bit lines ("BLs") to a portion of nonvolatile memory ("NVM") BLs.

10. The method of claim 9, further comprising activating a page buffer to load data from a RAM via the RAM BLs and NVM BLs.

11. The method of claim 1, further comprising activating an NVM programming cycle to write data in the page buffer to a plurality of NVM cells in a NVM.

12. The method of claim 11, further comprising turning off switch circuit to disconnect at least a portion of RAM BLs from a portion of NVM BLs while the NVM programming cycle continues.

13. The method of claim 1, further comprising receiving information from a processing unit to the RAM while the programming nonvolatile memory cell in the first nonvolatile memory string continues.

14. The method of claim 1, further comprising interrupting an NVM programming cycle when a data request to the NVM is received.

15. The method of claim 6 further comprising activating a first drain select gate ("DSG") signal at a first DSG allowing an output terminal of a static random-access memory ("SRAM") to be connected to a first nonvolatile memory string having at least two nonvolatile memory ("NVM") cells capable of storing two logic values.

16. The method of claim 15 further comprising driving one of first world lines ("WLs") connected to the nonvolatile memory cells of the first nonvolatile memory string to a programming voltage and driving remaining first WLs to pass voltages.

17. The method of claim 16 further comprising deactivating the first DSG signal at the first DSG to logically disconnect the first nonvolatile memory string from the SRAM while programming nonvolatile memory cell in the first nonvolatile memory string continues.

18. The method of claim 17, further comprising activating a second DSG signal at a second DSG coupled to the output terminal of the SRAM to connect a second nonvolatile memory string to the SRAM.

19. The method of claim 18, further comprising driving one of second WLs connected to nonvolatile memory cells of the second nonvolatile memory string to a programming voltage and driving remaining second WLs to pass voltages.

20. The method of claim 19, further comprising deactivating the second DSG signal at the second DSG to logically disconnect the second nonvolatile memory string from the SRAM while programming nonvolatile memory cell in the first nonvolatile memory string and programming nonvolatile memory cell in the second nonvolatile memory string continue.

* * * * *